(12) United States Patent
Yasumoto et al.

(10) Patent No.: US 10,081,170 B2
(45) Date of Patent: Sep. 25, 2018

(54) LAMINATING APPARATUS

(71) Applicants: NICHIGO-MORTON CO., LTD., Tokyo (JP); SHIN-ETSU CHEMICAL CO., LTD., Tokyo (JP)

(72) Inventors: Ryoichi Yasumoto, Machida (JP); Kazutoshi Iwata, Machida (JP); Kinya Kodama, Annaka (JP); Grigoriy Basin, San Francisco, CA (US)

(73) Assignees: NIKKO-MATERIALS CO., LTD., Tokyo (JP); SHIN-ETSU CHEMICAL CO., LTD., Tokyo (JP)

( * ) Notice: Subject to any disclaimer, the term of this patent is extended or adjusted under 35 U.S.C. 154(b) by 642 days.

(21) Appl. No.: 14/462,893

(22) Filed: Aug. 19, 2014

(65) Prior Publication Data

US 2015/0027640 A1    Jan. 29, 2015

Related U.S. Application Data

(62) Division of application No. 13/816,540, filed as application No. PCT/JP2011/066304 on Jul. 19, 2011, now Pat. No. 8,899,291.

(30) Foreign Application Priority Data

Aug. 20, 2010  (JP) ................ 2010-185418

(51) Int. Cl.
    *B32B 37/10* (2006.01)
    *B32B 39/00* (2006.01)
    (Continued)

(52) U.S. Cl.
    CPC .............. *B32B 37/10* (2013.01); *B29C 43/18* (2013.01); *B32B 37/1009* (2013.01);
    (Continued)

(58) Field of Classification Search
    CPC ..... B32B 37/10; B32B 37/1009; B32B 39/00; B29C 43/18
    See application file for complete search history.

(56) References Cited

U.S. PATENT DOCUMENTS

| 5,078,820 A | 1/1992 | Hamamura et al. |
| 6,481,482 B1 | 11/2002 | Shimotomai |

(Continued)

FOREIGN PATENT DOCUMENTS

| CN | 1301994 | 7/2001 |
| JP | 05-038796 | 2/1993 |

(Continued)

OTHER PUBLICATIONS

International Preliminary Report on Patentability for PCT/JP2011/066304 dated Mar. 19, 2013 (English-language translation).

(Continued)

*Primary Examiner* — Christopher T Schatz
(74) *Attorney, Agent, or Firm* — Greenblum & Bernstein, P.L.C.

(57) ABSTRACT

A laminating apparatus for a provisionally laminated body is provided and is configured to form an end laminated body including one of a first resin film and a second resin film conforming to protruding and recessed portions of a substrate. The laminating apparatus may include first and second laminating mechanisms. The first laminating mechanism may include a first enclosed space forming receiver, a depressurizer, a heater, and a first pressure laminator to form an intermediate laminated body from the provisionally laminated body. The second laminating mechanism may include a second enclosed space forming receiver, and a second pressure laminator to form the end laminated body from the intermediate laminated body.

5 Claims, 33 Drawing Sheets

(51) Int. Cl.
    *B29C 43/18*     (2006.01)
    *B32B 37/00*     (2006.01)
    *H01L 33/52*     (2010.01)
    *H05K 3/28*     (2006.01)

(52) U.S. Cl.
    CPC ............ *B32B 39/00* (2013.01); *B32B 37/003* (2013.01); *B32B 2309/12* (2013.01); *B32B 2309/65* (2013.01); *B32B 2309/68* (2013.01); *B32B 2457/08* (2013.01); *H01L 33/52* (2013.01); *H05K 3/284* (2013.01); *H05K 2203/1311* (2013.01); *Y10T 156/1744* (2015.01)

(56) References Cited

U.S. PATENT DOCUMENTS

| | | |
|---|---|---|
| 6,610,459 B1 | 8/2003 | Keil et al. |
| 8,899,291 B2 * | 12/2014 | Yasumoto ............... B32B 39/00 156/285 |
| 2003/0121604 A1 | 7/2003 | Keil et al. |
| 2007/0051462 A1 | 3/2007 | Nakayama et al. |
| 2008/0053609 A1 | 3/2008 | Renz |

FOREIGN PATENT DOCUMENTS

| | | |
|---|---|---|
| JP | 2004-058349 | 2/2004 |
| JP | 2004-249639 | 9/2004 |
| JP | 2009-166487 | 7/2009 |
| JP | 2009-190344 | 8/2009 |

OTHER PUBLICATIONS

Extended European Search Report in corresponding European Application No. 11818017.3, dated Jun. 2, 2014.
Chinese Office action dated Jul. 1, 2014, along with English-language translation.

* cited by examiner

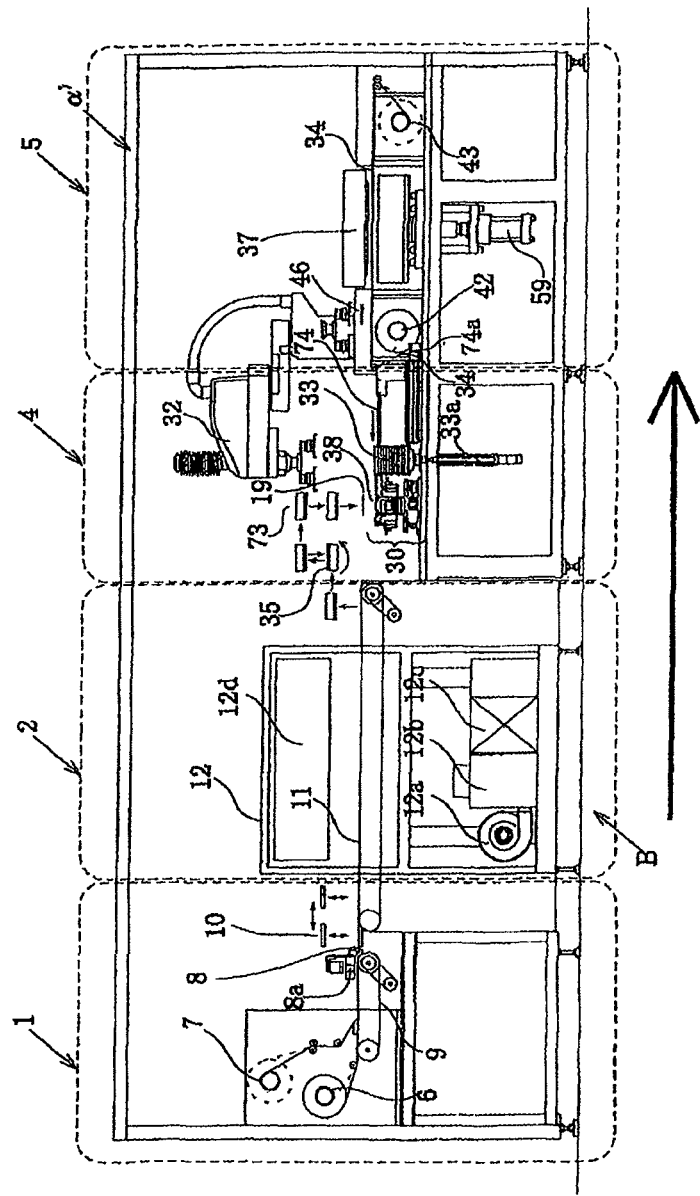

LAMINATING APPARATUS

CROSS REFERENCE TO RELATED APPLICATIONS

This application is a divisional application of co-pending U.S. patent application Ser. No. 13/816,540, filed Feb. 12, 2013, which is a U.S. National Stage Application of International Application No. PCT/JP2011/066304, filed Jul. 19, 2011, the disclosures of which are expressly incorporated by reference herein.

This application claims priority of Japanese Patent Application Nos. 2010-185418, filed Aug. 20, 2010 the disclosures of which are expressly incorporated by reference herein.

TECHNICAL FIELD

The present application relates to a laminating apparatus for laminating a resin film to a substrate having protruding and recessed portions in the manufacture of an electronic circuit board and a semiconductor device. More particularly, the present application relates to a laminating apparatus which achieves a high degree of film thickness uniformity of a resin film laminated to a substrate and which suppresses the creation of microvoids between the substrate and the resin film.

BACKGROUND ART

In recent years, with the decreasing size and increasing performance of electronic devices, the increases in density and in the number of layers of electronic circuit boards for use in the electronic devices have taken place. For the increase in the number of layers of such electronic circuit boards, there is a requirement for smoothness of the surface of a laminated body obtained by laminating a resin film to a substrate having protruding and recessed portions. An example of a laminating apparatus which meets such a requirement is disclosed in Patent Literature 1. In this apparatus, a resin film made of a thermosetting resin composition or a photosensitive resin composition and a substrate are accommodated in one out of two enclosed spaces divided by a flexible sheet made of an expansive material. After the pressure in both of the aforementioned two divided enclosed spaces is reduced, the pressure in only the other enclosed space in which the resin film and the substrate are not accommodated is brought back to normal pressure or further increased to expand the flexible sheet made of the expansive material toward the pressure-reduced enclosed space (the enclosed space in which the resin film and the substrate are accommodated). The expanded flexible sheet applies pressure equally to the resin film and the substrate. Thus, the apparatus laminates the resin film and the substrate together. According to this apparatus, the aforementioned flexible sheet is expanded like a balloon by a difference in air pressure between the two enclosed spaces divided by the aforementioned flexible sheet made of the expansive material, so that part of the flexible sheet which contacts the substrate is deformed along the protruding and recessed portions of the substrate. In that state, pressure is applied to the resin film and the substrate. Thus, even when the substrate has protruding and recessed portions, this apparatus is capable of bringing the resin film into intimate contact with the protruding and recessed portions of the substrate.

CITATION LIST

Patent Literature

PTL 1: JP-A-2004-249639

SUMMARY OF INVENTION

However, the aforementioned apparatus is an apparatus which gives a higher priority to the fact that the spacings between the protruding and recessed portions of the substrate are so small that it is difficult to completely bring the resin film into intimate contact with the protruding and recessed portions of the substrate or the fact that no microvoids are created between the substrate and the resin film when the substrate has large protruding and recessed portions. This apparatus has the function of forming the surface of the resin film laminated onto the substrate into a flat surface by using a flat pressing plate in a subsequent step. For this reason, the uniformity of the film thickness of the laminated resin film is not taken so much into consideration. For example, the aforementioned apparatus presses the expanded flexible sheet against the resin film to bring the flexible sheet into intimate contact with the protruding and recessed portions of the substrate, thereby laminating the resin film to the substrate. Thus, when the spacings between the protruding and recessed portions of the substrate are small or when the protruding and recessed portions of the substrate are large, the flexible sheet conforming to the protruding and recessed portions of a to-be-laminated body is difficult to expand. This causes the resin film placed on the substrate to have portions highly pressurized by the aforementioned flexible sheet and other portions. As a result, portions of the resin film which are placed near the tops of the protruding portions of the substrate are more highly pressurized by the aforementioned flexible sheet than other portions thereof to become longer and thinner. Thus, there is shown a trend such that the resin film cannot be laminated to the substrate while the film thickness of the resin film is held uniform on a stricter level.

In view of the foregoing, the present application provides a laminating apparatus which is capable of causing a resin film to completely fit protruding and recessed portions of a substrate, thereby laminating the resin film to the substrate, even when the spacings between the protruding and recessed portions of the substrate are small or when the protruding and recessed portions of the substrate are large, and which is capable of making the film thickness of the laminated resin film uniform on a stricter level.

To accomplish the aforementioned, the present application discloses a laminating apparatus for a provisionally laminated body including a substrate having front and back surfaces at least one of which has protruding and recessed portions, and one of a first resin film and a second resin film attached to an uneven surface of the substrate, the second resin film including a support film, the laminating apparatus being configured to form an end laminated body including one of the first resin film and the second resin film conforming to the protruding and recessed portions of the substrate. The laminating apparatus may include a laminating mechanism including: an enclosed space forming receiver capable of receiving the provisionally laminated body therein; and a pressure laminator for applying pressure to the provisionally laminated body in non-contacting relationship with one of the first resin film and the second resin film in an enclosed space formed by the enclosed space forming receiver to laminate one of the first resin film and the second resin film to the substrate, thereby forming the end laminated body from the provisionally laminated body.

The present inventors have made studies to address challenges of making the film thickness of the resin film laminated to the substrate having protruding and recessed portions uniform on a stricter level and of laminating the resin film to the substrate without the creation of microvoids between the substrate and the resin film even when the substrate has large protruding and recessed portions. In the course of the studies, the present inventors have found that the nonuniform film thickness of the resin film laminated on the substrate having the protruding and recessed portions results from the following facts. During the lamination of the resin film to the substrate, the expanded flexible sheet cannot come into intimate contact with the protruding and recessed portions of the substrate when the substrate has the large protruding and recessed portions as mentioned above. This causes the resin film placed on the substrate to have portions forced hard against (in contact with) the substrate and other portions, resulting in the nonuniformity in the film thickness of the laminated resin film. Then, the present inventors have made further studies of whether or not the resin film can be laminated to the substrate by applying pressure to the resin film without using the flexible sheet in what is called non-contacting relationship, rather than by expanding the flexible sheet to press the flexible sheet against the resin film. As a result, the present inventors have found the following process. Prior to the lamination of the resin film to the substrate by applying pressure to the resin film, a provisionally laminated body such that the resin film is merely overlaid on the substrate is placed in an enclosed space. Air or the like is injected into the enclosed space to force the resin film against the substrate by using the pressure of the air or the like. This causes the resin film to fit the protruding and recessed portions of the substrate, thereby providing a laminated body (an end laminated body).

According to a non-limiting embodiment of the present application, the laminating apparatus may include a laminating mechanism including: an enclosed space forming receiver for receiving a provisionally laminated body having a resin film overlaid on and attached to a substrate; and a pressure laminator for applying pressure to the resin film of the provisionally laminated body in non-contacting relationship to cause the resin film to fit protruding and recessed portions of the substrate, thereby forming an end laminated body. Thus, the apparatus eliminates the need to cause the resin film to fit the protruding and recessed portions of the substrate by using the expanding force of a flexible sheet to produce a laminated body (the end laminated body), and is capable of forming the end laminated body by applying pressure to the resin film in non-contacting relationship. The achievement of the application of pressure to the resin film in non-contacting relationship allows the lamination of the resin film without the support film to the substrate, thereby allowing the resin film to exhibit the flexibility thereof. Thus, if the degree of protruding and recessed portions of the substrate is relatively large, a laminated body (the end laminated body) such that the resin film and the substrate are in intimate contact with each other at a higher level is provided without the creation of microvoids between the resin film and the substrate. Also, the pressure of gas is used by using air pressure and the like to laminate the resin film to the substrate. This causes the film thickness of the resin film laminated to the substrate having the protruding and recessed portions to be a uniform thickness on a stricter level.

In the manufacture of products hardened by at least one of heat and light after the lamination of the resin film and the substrate with light-emitting elements such as optical semiconductor elements mounted thereon, a dry film solder mask requires the protection of the support film for the purpose of preventing the resin layer from directly contacting an optical mask and the like in a subsequent step and also requires the process of removing the support film after the lamination. Unlike such a dry film solder mask, the laminating apparatus is capable of placing the resin film from which the support film is previously removed on the substrate to apply pressure directly to the resin film. Also, the laminating apparatus is capable of significantly reducing variations in the film thickness of the laminated resin film. Thus, the laminating apparatus laminates the resin film to the substrate with light-emitting elements such as optical semiconductor elements mounted thereon to provide excellent optical semiconductor devices reduced in optical color irregularities.

According to another non-limiting embodiment of the present application, when the laminating mechanism further includes a depressurizer for forming a second provisionally laminated body from the provisionally laminated body in the enclosed space, the second provisionally laminated body having a space placed under a negative pressure between the substrate and one of the first resin film and the second resin film, and a heater for heating the provisionally laminated body in the enclosed space to seal a peripheral portion of the resin film and the substrate to each other, the air pressure in the enclosed space of the laminating mechanism is made higher than the air pressure in the negative-pressure space of the second provisionally laminated body, whereby pressure is applied to the resin film by the pressurizing force resulting from the difference in air pressure in non-contacting relationship. Thus, the resin layer of the resin film is not attached to a pressurizer even when the resin film layer is laminated to the substrate by applying pressure to the resin film layer while the support film required to cover the surface of the resin film for the purpose of protecting the resin layer having adhesion and adhesiveness of the resin film is removed. The flexibility of the resin film itself is not hindered by the support film, but the conformability of the resin film to the substrate is improved. For this reason, the substrate and the resin film are in completely intimate contact with each other. This is preferable because no partial microvoids are created between the resin film and the substrate.

According to yet another non-limiting embodiment of the present application, when the laminating mechanism includes a heater for heating the second provisionally laminated body and the end laminated body to cause the resin film to firmly conform to the substrate during the formation of the end laminated body from the second provisionally laminated body in the enclosed space, the conformability of the resin film to the substrate in the second provisionally laminated body is improved. This forms the end laminated body having a higher degree of intimate contact between the resin film and the substrate.

According to sill another non-limiting embodiment of the present application, when the laminating apparatus for the provisionally laminated body includes the laminating mechanism, and a second laminating mechanism including: an enclosed space forming receiver capable of receiving the provisionally laminated body therein; a depressurizer capable of placing a space between one of the first resin film and the second resin film and the substrate of the provisionally laminated body under a negative pressure in the enclosed space formed by the enclosed space forming receiver; a heater capable of heating one of the first resin film and the second resin film of the provisionally laminated body; and a second pressure laminator for laminating one of the first resin film and the second resin film of the provisionally laminated body to protruding portions of the substrate to form a provisionally laminated body including the substrate integrated with one of the first resin film and the second resin film, the resin film is supported by the support film, so that the resin film and the substrate are brought close to each other and integrated together while the resin film layer not distorted in shape but maintained planar is in opposed relation to the substrate. This provides the provisionally laminated body in which the resin film free from wrinkles is overlaid on the substrate. Therefore, the end laminated body is provided in which the thickness of the resin film is more uniform and in which no microvoids are created between the resin film and the substrate.

According to a non-limiting embodiment of the present application, when the laminating apparatus for the provisionally laminated body includes the laminating mechanism, and a third laminating mechanism including: an enclosed space forming receiver capable of receiving the provisionally laminated body therein; a depressurizer capable of placing a space between the resin film and the substrate of the provisionally laminated body under a negative pressure in the enclosed space formed by the enclosed space forming receiver; a heater capable of heating the resin film of the provisionally laminated body; and a pressure laminator for laminating a peripheral portion of the resin film of the provisionally laminated body to the substrate to form the second provisionally laminated body, the second provisionally laminated body is formed rapidly, and the space between the substrate and the resin film is sealed efficiently with reliability.

According to another non-limiting embodiment of the present application, when the pressure laminator further includes a controller for controlling applied pressure, the formation of the end laminated body from the second provisionally laminated body is done at a controlled and moderate speed, as compared with the process of injecting air at atmospheric pressure or at increased set pressure into the enclosed space of the depressurized laminating mechanism in a single step. This further improves the uniformity of the film thickness of the laminated resin film layer.

According to yet another non-limiting embodiment of the present application, when the laminating apparatus further includes: a first transporting mechanism for transporting the provisionally laminated body to the second or third laminating mechanism; a second transporting mechanism for transporting to the laminating mechanism the provisionally laminated body or the provisionally laminated body formed by the second or third laminating mechanism and configured such that the resin film is laminated to the protruding portions of the substrate and integrated with the substrate; and a third transporting mechanism for transporting the end laminated body formed by the laminating mechanism out of the laminating mechanism, the steps of forming the provisionally laminated body, forming the provisionally laminated body or the second provisionally laminated body in which the resin film and the substrate are integrated together, and forming the end laminated body may be performed in a dispersed manner. This improves the efficiency of the process of forming the end laminated body, and allows the setting of optimum conditions for the formation on a step-by-step basis.

According to still another non-limiting embodiment of the present application, when the laminating apparatus further includes a support film remover for removing the support film from the second resin film, the support film may be removed from the resin film in the laminating step. Thus, the laminating apparatus is capable of closely laminating the resin film to the substrate more easily and conveniently, depending on the degree of protruding and recessed portions of the substrate and the type of resin film.

According to a non-limiting embodiment of the present application, when the support film remover includes a controller for operating the support film remover so as to remove the support film from one of the second resin film of the provisionally laminated body and the second resin film prior to the formation of the provisionally laminated body, the support film is removed more easily and beautifully, which in turn is preferable.

According to another non-limiting embodiment of the present application, when the laminating apparatus further includes: a cutter for cutting one of the first resin film and the second resin film to a predetermined size; and a precurer for precuring one of the first resin film and the second resin film, the precurer is capable of controlling the concentration of a solvent remaining on the resin film and the degree of thermal hardening, depending on the size of the protruding and recessed portions of the substrate and the like. Precuring one of the first resin film and the second resin film suppresses the excessive flowing of the resin film placed on the substrate which in turn results in the reduction in the film thickness of the resin film laminated to the upper surface of the protruding portions of the substrate and to the peripheral portion of the substrate. The precuring also increases the strength of the resin film so as not to become excessively longer when the resin film fits the protruding and recessed portions of the substrate, thereby improving the uniformity of the film thickness of the resin film laminated to the substrate. Also, by measuring the degree of softening of the resin film which is one of the first resin film and the second resin film, the heating conditions may be set in the pressure laminator corresponding to a subsequent step, based on the measurement data. This provides the end laminated body in a desired state with higher reliability. Further, before or after the precure, the cutter cuts one of the first resin film and the second resin film which is of an elongated strip-shaped configuration wound on a core to a predetermined size for use in the lamination to the provisionally laminated body. This achieves the full automation of all of the steps of forming the end laminated body from one of the first resin film and the second resin film wound on a roll.

The term "provisionally laminated body" as used in the present application may refer to a laminated body in such a condition that the resin surface of a resin film and the like (referred to hereinafter as "a resin film or a resin film with a support film") neither intimately contacts nor conforms to the uneven surface of a substrate having protruding and recessed portions. In particular, the provisionally laminated body in such a condition that the resin film and the like are overlaid on the substrate while the resin surface of the resin film and the like is opposed to the uneven surface of the substrate having protruding and recessed portions may refer to as a "provisionally laminated body PL1", and the provisionally laminated body in such a condition that the space between the uneven surface of the substrate and the resin film and the like is sealed by the contact between the substrate and the peripheral portion of the resin film and the like of the provisionally laminated body PL1 to form a depressurized enclosed space may be referred to as a "provisionally laminated body PL2".

As used in the present application, the expression "applying pressure to one of a resin film and a resin film with a support film in 'non-contacting relationship'" refers to "applying pressure to one of the resin film and the resin film with the support film) in 'non-contacting relationship with a tangible object such as a flexible sheet.'"

As used in the present application, a provisionally laminated body (PL1) including one of a resin film and a resin film with a support film "attached to" a substrate may refer to a provisionally laminated body (PL1) in such a condition that the resin film and the like are merely overlaid on the substrate while the resin surface of the resin film and the like is in opposed relation to the uneven surface of the substrate, and a provisionally laminated body (PL1) or (PL2) in which one of a resin film and a resin film with a support film is integrated with a substrate may refer to a provisionally laminated body (PL1) or (PL2) in such a condition that one of the resin film and the resin film with the support film is overlaid on the substrate and is further pressurized and that the substrate and one of the resin film and the resin film with the support film are integrated together to such a degree that one of the resin film and the resin film with the support film cannot be easily separated from the substrate.

BRIEF DESCRIPTION OF DRAWINGS

FIG. 21 is a sectional view of yet another embodiment of the present application.

DESCRIPTION OF EMBODIMENTS

Next, embodiments according to the present invention will now be described. It should be noted that the present invention is not limited to the embodiments.

Figure 1:
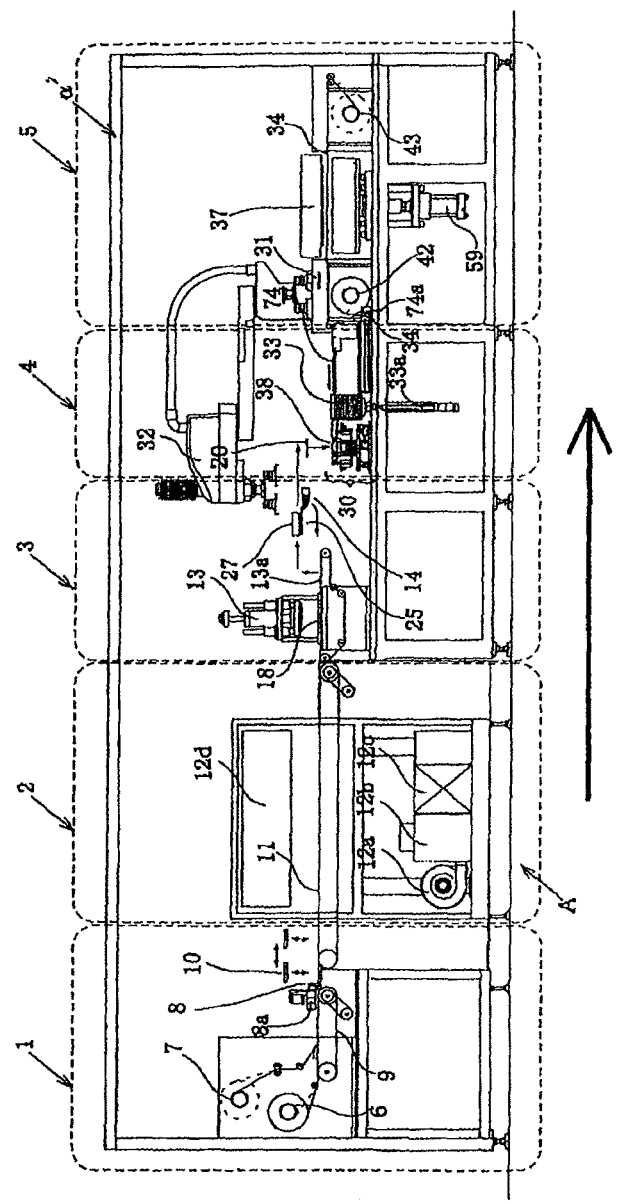
FIG. 1 is a sectional view of one embodiment of the present application.
Figure 29:
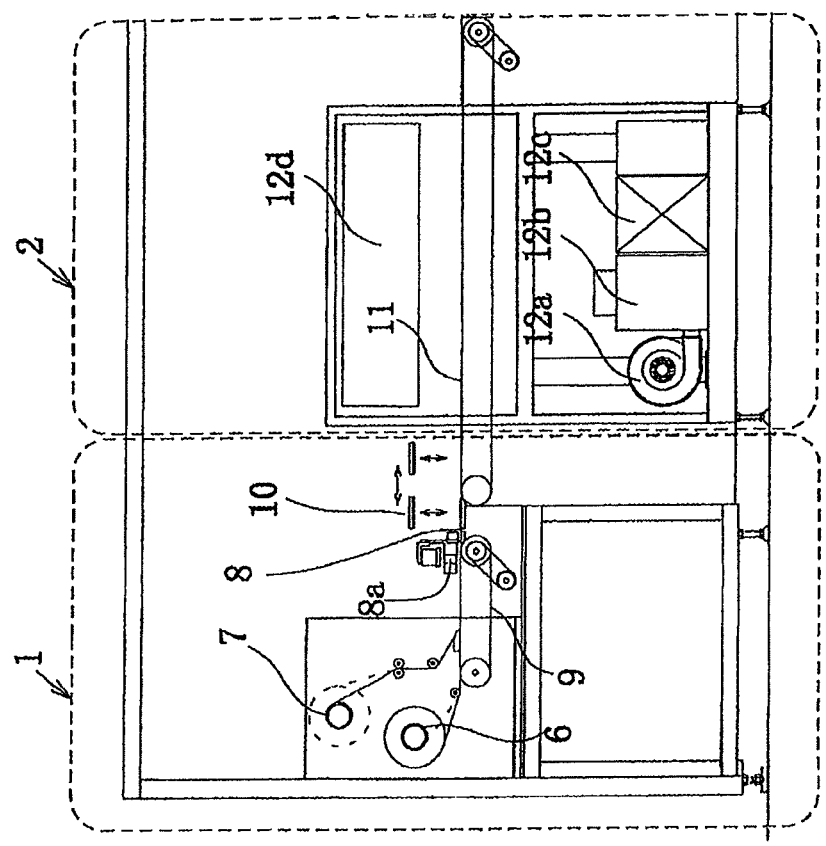
FIG. 29 is a partially enlarged illustration of FIG. 1.
Figure 30:
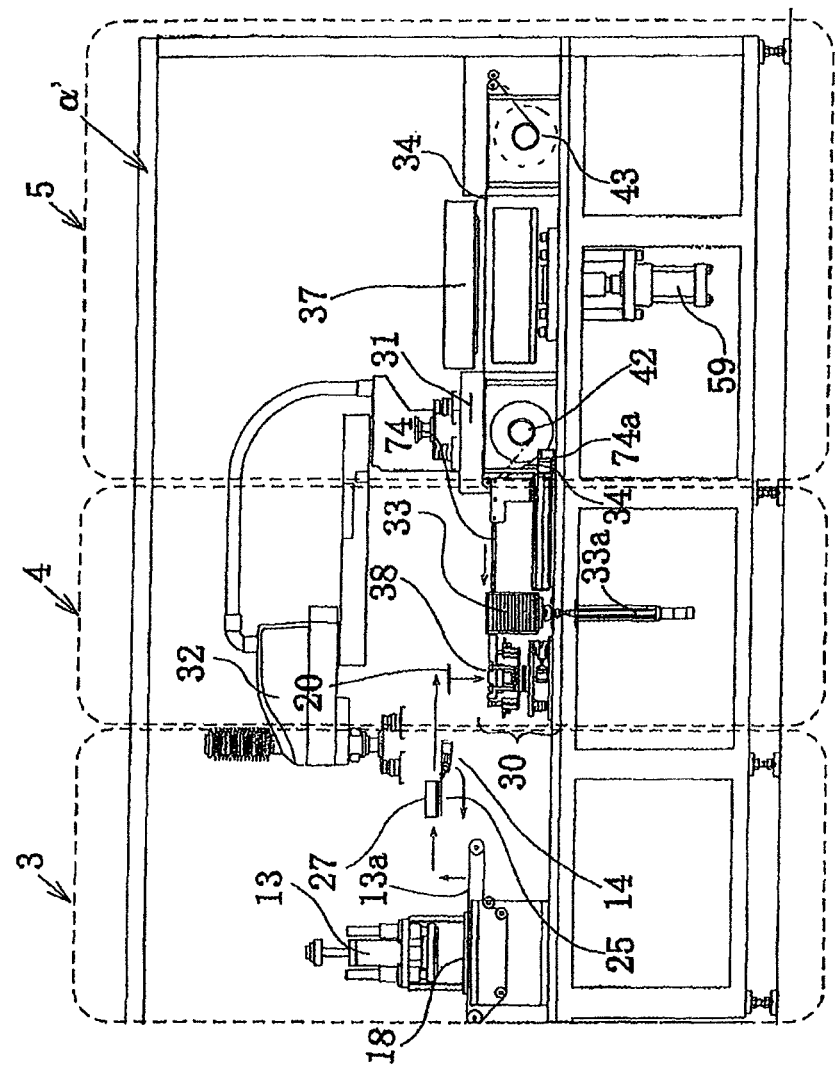
FIG. 30 is a partially enlarged illustration of FIG. 1.

FIG. 1 shows a laminating apparatus according to one embodiment of the present invention. This laminating apparatus A is an apparatus for laminating a resin film made of a silicone resin and the like to a substrate having protruding and recessed portions. The laminating apparatus A includes a cutting block 1 for cutting an elongated strip-shaped resin film with a support film, a precure block 2 for precuring the resin film with the support film, a removing block 3 for removing the support film from the resin film with the support film, a provisionally laminated body forming block 4 for forming a provisionally laminated body, and an end laminated body forming block 5 for forming an end laminated body. As shown, the blocks 1 to 5 are disposed in the order named from upstream (the cutting block 1) to downstream (the end laminated body forming block 5) in the flow direction indicated by the arrow. The reference character a' designates an entire cover for accommodating the aforementioned blocks 1 to 5. The entire cover a' includes safety doors not shown which are provided on side surfaces for the respective blocks, and HEPA filters not shown which are provided on the ceilings for the respective blocks for the purpose of further cleaning air in a clean room in which the present laminating apparatus is installed. Partially enlarged views of FIG. 1 are shown in FIG. 29 (the blocks 1 and 2) and in FIG. 30 (the blocks 3 to 5). Parts are schematically shown in FIG. 1. The size, thickness and the like of the parts shown in FIG. 1 are different from the actual ones (the same holds true for the following figures).

First, the aforementioned cutting block 1 has the function of removing a cover film from the elongated strip-shaped resin film with the support film which is wound around a core tube and which has the cover film on the inner side and the support film on the outer side, and the function of cutting this to a predetermined length. Specifically, this cutting block 1 includes an unwind roll 6 around which the resin film with the support film and with the aforementioned cover film is wound, a cover film take-up roll 7 for winding up the cover film removed from the aforementioned resin film with the support film, a disc cutter 8 for cutting the resin film with the support film from which the cover film is removed to a predetermined length, a transport conveyor 9, and a suction transport plate 10.

Figure 2:
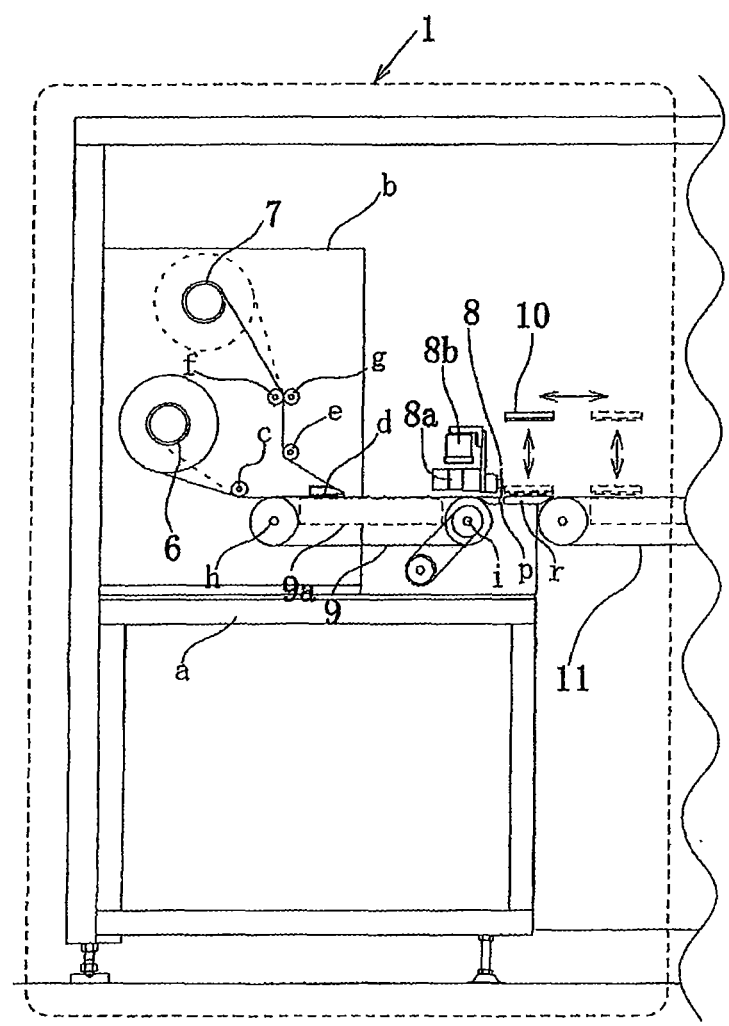
FIG. 2 is a partial sectional view of the one embodiment.

More specifically, as shown in FIG. 2, the aforementioned unwind roll 6 having a predetermined width is provided in a support plate b extending upwardly from a base a, and unwindably holds the aforementioned resin film with the support film. Also, the unwind roll 6 is controlled by a servomotor designated by the reference character k in FIG. 3 which is a top view of the laminating apparatus A of FIG. 1 so as to rotate in a direction opposite from the unwinding direction of the resin film with the support film, thereby apply a constant tension to the unwound resin film with the support film. The aforementioned take-up roll 7 is provided in the support plate b, and is rotatably driven by a servomotor designated by the reference character 1 in FIG. 3 to wind up the cover film removed from the resin film with the support film by a removal plate d and paid out through a guide roll e from nip rolls f and g. The nip roll f is driven by a servomotor designated by the reference character m in FIG. 3, and the nip roll g having no driving means is pressed by an air cylinder not shown against the nip roll f.

Figure 3:
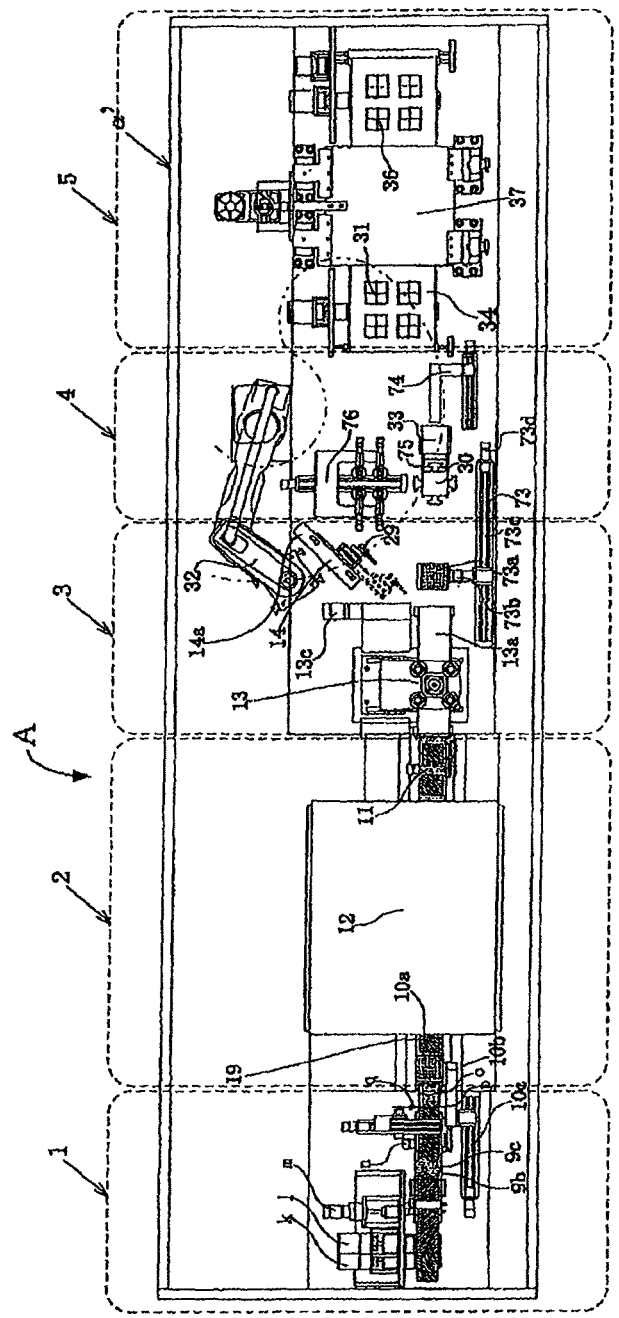
FIG. 3 is a top view of the one embodiment.
Figure 31:
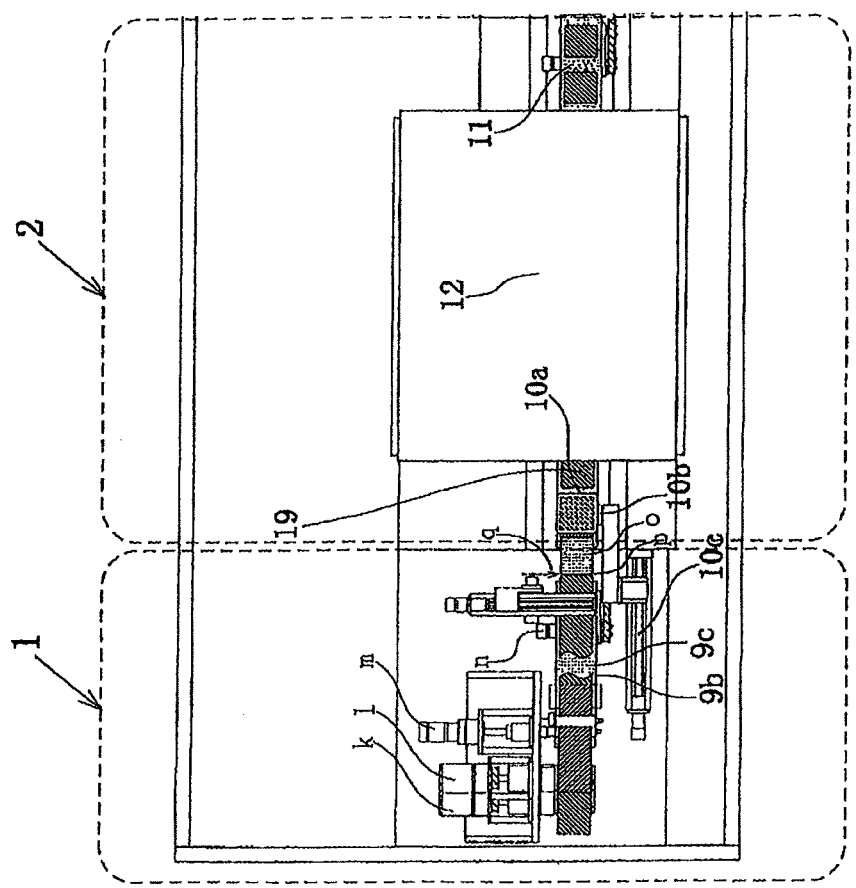
FIG. 31 is a partially enlarged illustration of FIG. 3.
Figure 32:
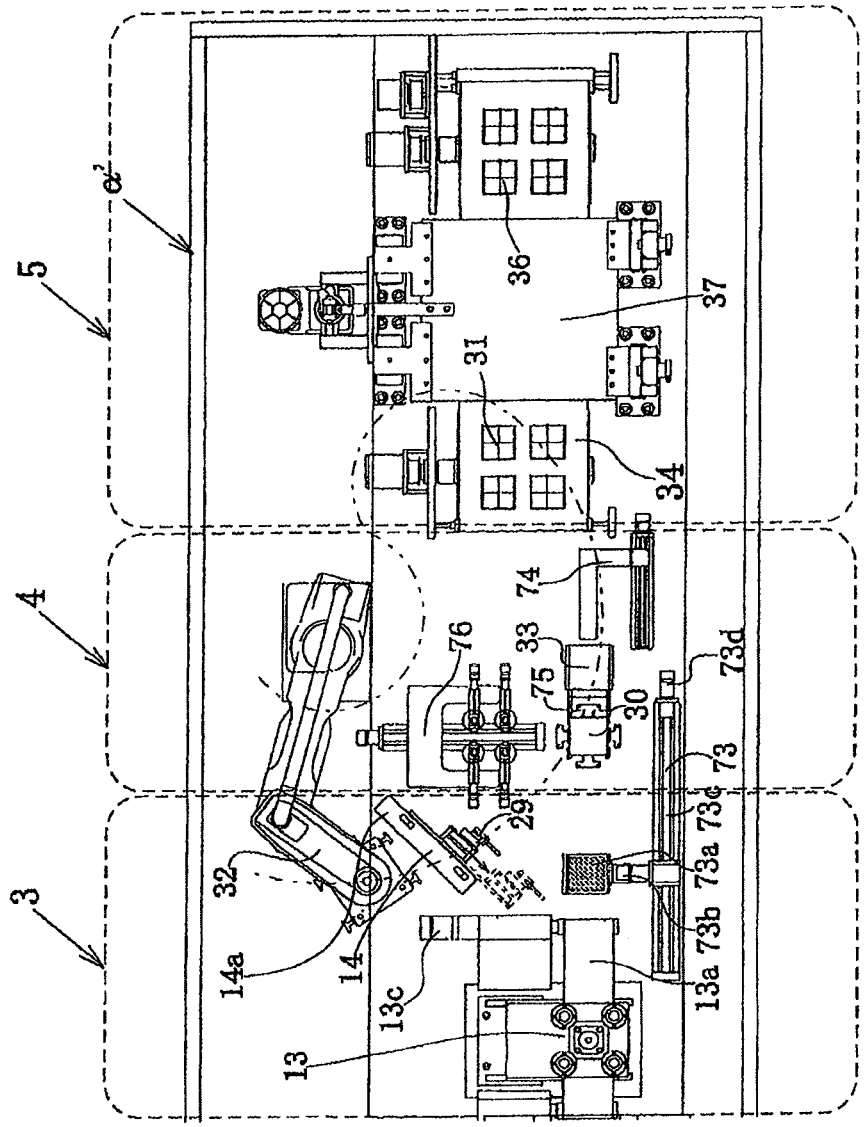
FIG. 32 is a partially enlarged illustration of FIG. 3.

The transport conveyor 9 includes a conveyor belt 9b made of stainless steel, and a driving roll i. As shown in FIG. 3, the aforementioned conveyor belt 9b has a surface with a large number of suction holes 9c. The conveyor belt 9b has an endless shape, and is looped around a support roll h and the driving roll i. The driving roll i is driven by a servomotor designated by the reference character n in FIG. 3. The feed speed and the amount of feed of the resin film with the support film are controlled by the nip rolls f and g and the servomotor n which drives the driving roll i. The rotary power of the unwind roll 6 is controlled so that a constant set tension is applied to the resin film with the support film supplied from the unwind roll 6 to the transport conveyor 9. The take-up roll 7 is controlled to wind up the cover film paid out from the nip rolls f and g under a set constant tension. This transport conveyor 9 has a suctioning function because a depressurization chamber designated by the reference character 9a in FIG. 2 is in communication with the suction holes 9c provided in the surface of the conveyor belt, and transports the resin film with the support film held thereon under suction. In the course of the transport, the removal plate designated by the reference character d in FIG. 2 changes the transport direction of the cover film to an obliquely rearward direction different from the transport direction of the resin film with the support film, so that the cover film is removed from the resin film with the support film. Partially enlarged views of FIG. 3 are shown in FIG. 31 (the blocks 1 and 2) and in FIG. 32 (the blocks 3 to 5).

A bridge plate r places thereon the resin film with the support film transported from the transport conveyor 9, and moves the resin film with the support film by sliding the resin film with the support film thereon. The resin film with the support film removed from the cover film and transported by the transport conveyor 9 onto the bridge plate r is initially laid under tension over a disc cutter running groove p, and is suctioned by a suction means not shown through suction holes o provided on the bridge plate r. Thus, the resin film with the support film is fixed for the cutting so as not to be out of position. Next, while the disc cutter 8 is rotated by a stepping motor designated by the reference character 8a in FIG. 2, an LM actuator (8b) for converting the rotary motion of the servomotor into a linear motion by using a built-in ball screw causes the disc cutter running groove p in FIG. 3 in a direction indicated by the arrow q, whereby the disc cutter 8 cuts the resin film with the support film fixed on the bridge plate r to a predetermined length. The disc cutter 8 may be returned to the position shown in FIG. 3. Alternatively, the disc cutter 8 may be on standby in that position, run in a direction opposite from the direction indicated by the arrow q after the next predetermined length of the resin film with the support film is fed from the transport conveyor 9 and held onto the bridge plate r under suction, and then cut the resin film with the support film. It should be noted that the bridge plate r incorporates a heater not shown which heats the resin film with the support film transported from the transport conveyor 9. This suppresses the production of fine swarf (particles) during the cutting.

As shown in FIG. 3, the suction transport plate 10 has a suctioning function using a suction device (not shown) for suctioning a suction part 10a, an upward and downward driving function using an air cylinder 10b, and a leftward and rightward moving function using an LM actuator 10c. This suction transport plate 10 moves downwardly by operating the air cylinder 10b from the position shown in FIG. 2, holds the resin film with the support film cut to a predetermined dimension under suction, moves upwardly back to the original height by operating the air cylinder 10b, then moves horizontally by operating the LM actuator 10c rightwardly as seen in the figure, subsequently moves downwardly by operating the air cylinder 10b, releases the holding of the resin film with the support film cut to a predetermined dimension (referred to hereinafter as a "cut resin film") 19 under suction, and placing this cut resin film 19 onto a transport conveyor 11 extending from the precure block 2 for a subsequent step. Examples of the suction part 10a of the suction transport plate 10 used herein may be any suction means including a vacuum chuck in which a sintered body of metal or a porous member made of carbon and the like is used for the suction part, an electrostatic chuck using a dielectric such as polyimide, a suction pad using Bernoulli effect, and the like.

The precure block 2 (referring again to FIG. 1) has a precure function of precuring the cut resin film 19. The precure block 2 includes the transport conveyor 11 shared with the aforementioned cutting block 1 and the support film removing block 3, and a circulating hot air oven (referred to hereinafter as an "oven") 12 disposed under the transport conveyor 11. The oven 12 includes a blower fan 12a for circulation of air flow within the precure block, a duct heater 12b, a HEPA filter 12c, and a downflow supply outlet 12d.

More specifically, the transport conveyor 11 has a transport belt which is a mesh belt made of TEFLON, and is looped around a pair of support rolls rotatably supported by a support column not shown. This transport conveyor 11 has a transport surface which places thereon a plurality of cut resin films 19 in predetermined spaced apart relation to transport the cut resin films 19 in a direction indicated by the arrow shown. The oven 12 has a temperature detecting means and a temperature control means not shown. The duct heater 12b is provided in adjacent relation to the blower fan 12a and the HEPA filter 12c under the aforementioned transport conveyor 11. The duct heater 12b heats air circulating within the oven 12 for the purpose of causing the cut resin films 19 on the transport surface of the transport belt to reach a predetermined temperature. This heated air is fed to the HEPA filter 12c and is cleaned therein. The heated air is then circulated in such a manner as to pass through piping (not shown) extending upwardly within the precure block 2, to be blown downwardly out of the downflow supply outlet 12d, and to return into the oven 12. The air within the oven 12 is not only circulated in the aforementioned manner, but also may be exhausted by a blower fan and a gas flow rate adjusting means which are not shown for the purpose of exhausting gas emitted from the cut resin films 19. The cut resin films 19 placed on the transport surface of the transport belt of the transport conveyor 11 are transported for a prescribed time period by the transport conveyor 11 within the oven 12 set at a prescribed temperature. This causes a curing reaction in resin components of the resin film, so that the cut resin films 19 are, so to speak, B-staged.

Figure 4A:
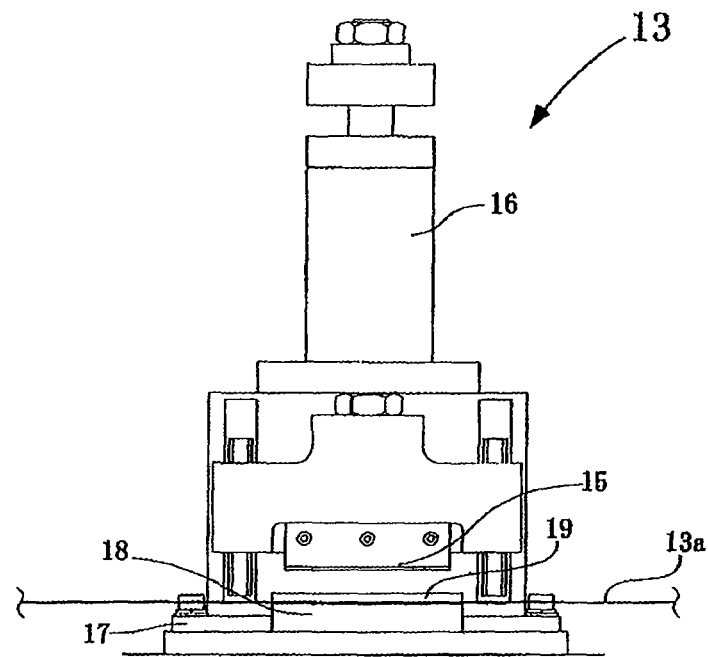
FIGS. 4A and 4B are illustrations of the one embodiment.
Figure 4B:
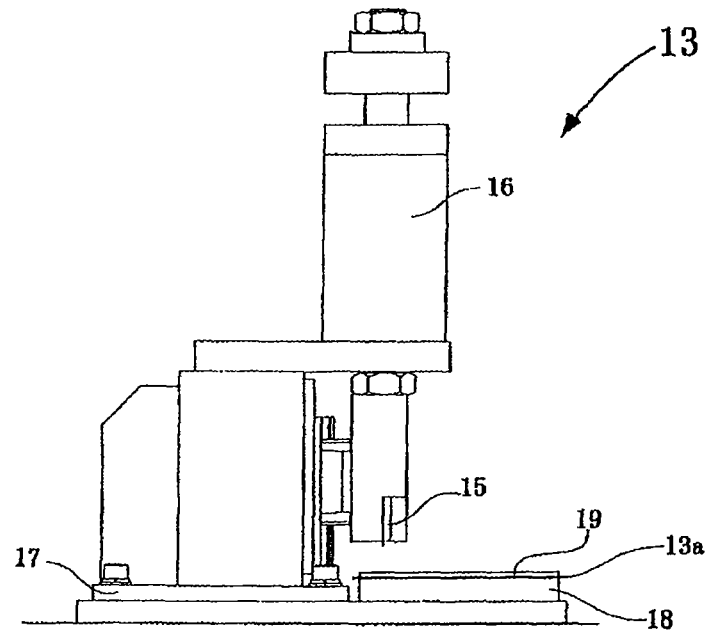
Figure 5:
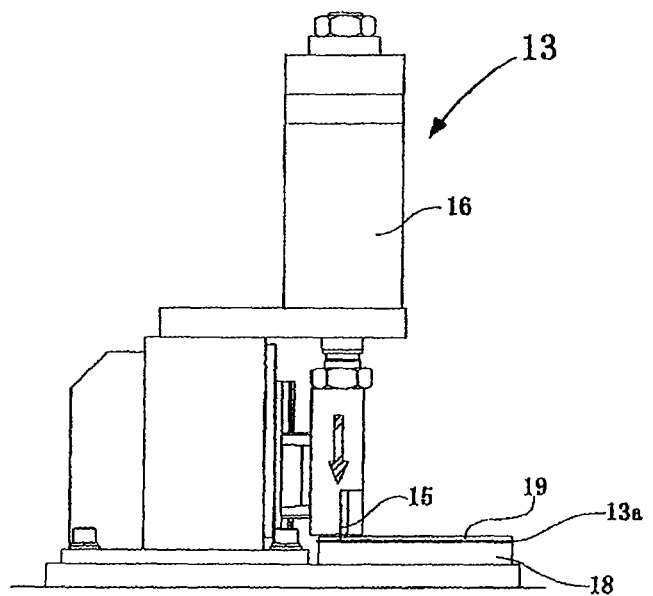
FIG. 5 is an illustration of the one embodiment.

The support film removing block 3 has a support film removing function of removing the support film from the back surface of a precured cut resin film 19. As schematically shown in FIGS. 1 and 3, the support film removing block 3 includes a half cutting device 13, and a support film removing device 14. More specifically, as shown in front view in FIG. 4A and in side view in FIG. 4B, the half cutting device 13 includes a cutting edge 15, a cylinder 16 for driving the cutting edge 15 upwardly and downwardly, a pedestal 17 for supporting the cylinder 16, and a mounting pad 18 for mounting thereon the cut resin film 19, with a transport conveyor 13a therebetween. With reference to FIG. 4A, the cut resin film 19 transferred from the transport conveyor 11 of the precure block 2 onto the transport conveyor 13a of the half cutting device 13 is positioned in the center of the half cutting device 13 (on the mounting pad 18) by a cut resin film 19 detecting means and the like not shown. The positioning is done by disposing a guide pin and the like not shown in FIG. 4B on the mounting pad 18 to the left of the cutting edge 15 lying above and to the left of the mounting pad 18 and then pressing the cut resin film 19 against the aforementioned guide pin and the like by means of an abutment and alignment means not shown. This determines the position of the cut resin film 19 relative to the mounting pad 18. Other positioning mechanisms than the above may be, for example, as follows. Before the cut resin film 19 is transferred from the transport conveyor 11 of the precure block 2 onto the transport conveyor 13a of the half cutting device 13, the cut resin film 19 is placed and positioned on a positioning means such as a centering table, and a transport mechanism similar to the suction transport plate 10 shown in FIG. 3 is thereafter used to place the cut resin film 19 onto the transport conveyor 13a on the mounting pad 18. Next, as shown in FIG. 5, the cylinder 16 is driven in a direction indicated by the arrow to move the cutting edge 15 downwardly toward the positioned cut resin film 19 until the cutting edge 15 passes through a resin film 20 which is a resin layer into an upper part of a support film 21. This provides the cut resin film 19 in such a condition that the resin film 20 is cut across the width thereof and a cut is made in the cut resin film 19 to a depth approximately equal to the thickness of the resin film 20. This is referred to as a "half cut." With reference to FIG. 3, the cut resin film 19 subjected to the half cut is transported from immediately under the half cutting device 13 in a rightward direction as seen in the figure by the transport conveyor 13a. The transported cut resin film 19 subjected to the half cut is held under suction by a suction plate 73a of a transfer arm 73 shown in FIG. 3, and lifted from the transport conveyor 13a by an LM actuator 73b. Then, the cut resin film 19 is sent to the support film removing device 14 by an LM actuator 73c.

Figure 6:
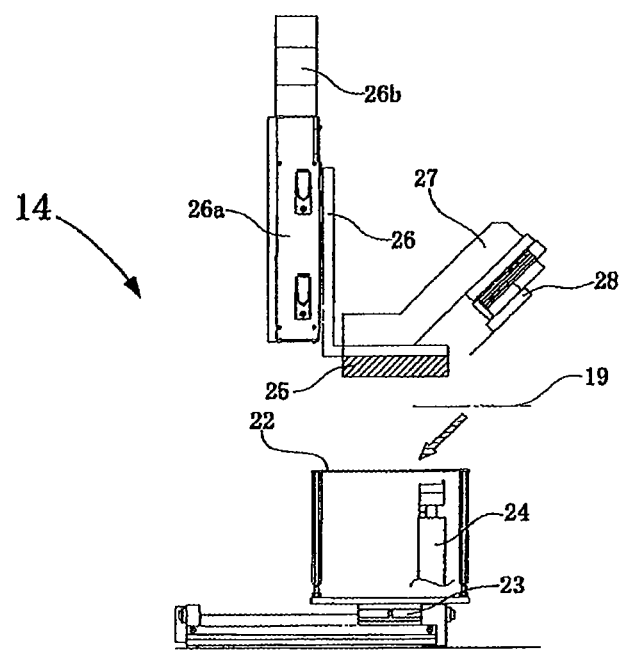
FIG. 6 is an illustration of the one embodiment.

As shown in FIG. 6, the support film removing device 14 includes a rest table 22 supported by leg portions at four corners and for placing thereon the cut resin film 19 subjected to the half cut and sent by the aforementioned transfer arm 73, an servomotor-driven LM actuator 23, a pressing arm 24 extending upwardly, an arm 27 having a suction pad 25 and upwardly and downwardly movable by vertically sliding a fixed plate 26 thereof by means of a servomotor-driven LM actuator 26a, a needle portion 28 mounted to this arm 27 movably back and forth, and a pinch portion 29 (not shown) movable in a predetermined direction. The aforementioned rest table 22 is horizontally movable by the slidable LM actuator 23 provided under the rest table 22. The LM actuator 23 is capable of moving horizontally by transmitting the rotation of a servomotor (not shown) serving as a driving source to a built-in ball screw. The pressing arm 24 is provided under the suction pad 25 and between the leg portions of the rest table 22, and is adapted to extend toward the suction pad 25 when the rest table 22 moves leftwardly as seen in the figure to create a space over the pressing arm 24. The arm 27 is mounted to the LM actuator 26a supported by a base so as to be movable via the fixed plate 26 along the LM actuator 26a, and has an inner suction passageway (not shown) which imparts a sucking force to the suction pad 25. The suction pad 25 is provided to hold the cut resin film 19 subjected to the half cut under suction, and is slightly smaller in size than the aforementioned cut resin film 19 subjected to the half cut. The needle portion 28 is mounted to the arm 27 so as to be movable back and force in the longitudinal direction of the arm. A needle is provided at the tip of the needle portion 28, and has a tip pointed toward the suction pad 25.

Figure 7:
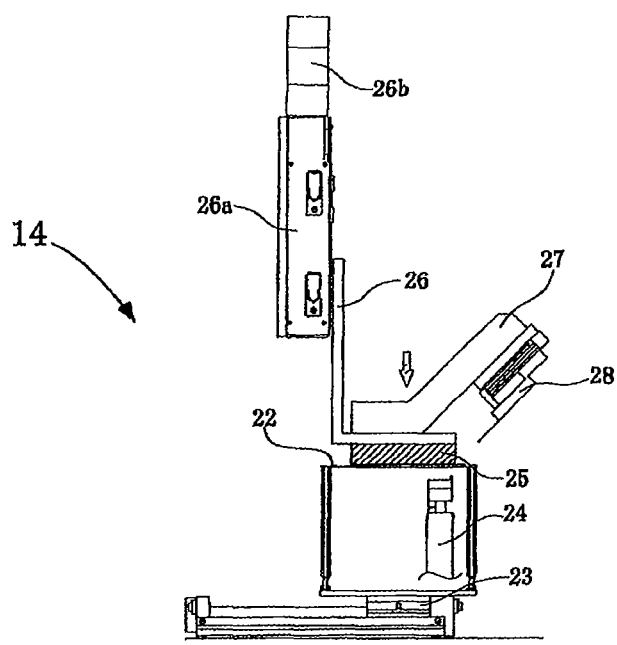
FIG. 7 is an illustration of the one embodiment.
Figure 8:
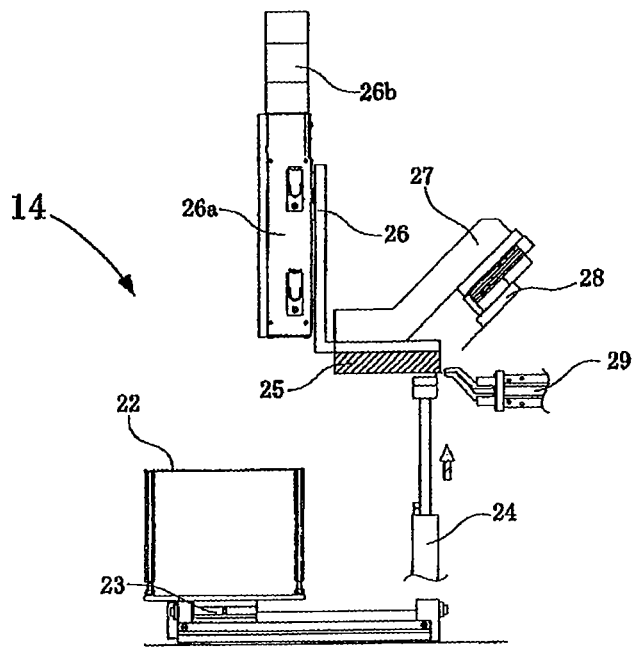
FIG. 8 is an illustration of the one embodiment.
Figure 9:
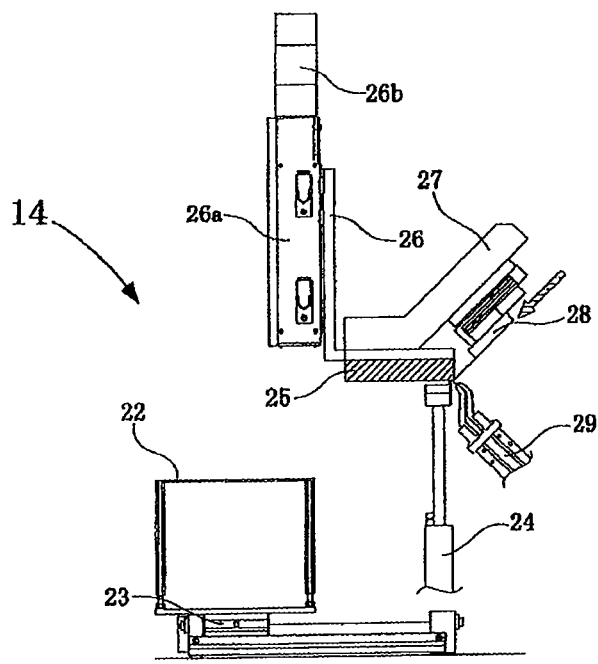
FIG. 9 is an illustration of the one embodiment.

Next, the cut resin film 19 subjected to the half cut is placed in a predetermined position on the rest table 22 of the support film removing device 14 by the transfer arm 73, as indicated by an arrow in FIG. 6. Then, the rest table 22 is moved to immediately under the suction pad 25. As indicated by an arrow in FIG. 7, the arm 27 is operated to move downwardly until the cut resin film 19 in the aforementioned condition is brought into contact with the suction pad 25 and held under suction by the suction pad 25. In that state, the suction pad 25 is lifted upwardly. At this time, the half-cut end portion of the aforementioned cut resin film 19 together with the support film 21 protrudes slightly from the suction pad 25 because the suction pad 25 is slightly smaller in size than the cut resin film 19. The pinch portion 29 is provided to grasp the protruding end portion. A pair of pinch lugs at the front end of the pinch portion 29 are opened and closed by an air cylinder of the pinch portion 29 to perform a pinching operation. The pinch portion 29 has a rear end pivoting downwardly about the front end thereof. The entire pinch portion 29 is movable horizontally in a diagonal direction of the cut resin film by an LM actuator 14a mounted to the support film removing device shown in FIG. 3. After the pinch portion 29 grasps the protruding end portion of the cut resin film 19, the rest table 22 moves laterally, and the pressing arm 24 moves upwardly from the resultant space. Then, the suction pad 25 and the pressing arm 24 hold the end portion of the cut resin film 19 therebetween to fix the end portion (FIG. 8). In that state, the opposite side of the pinch portion 29 from the grasped portion is moved downwardly about the portion where the pinch portion 29 grasps the end portion of the cut resin film 19, as shown in FIG. 9. This movement causes the end portion of the cut resin film 19 grasped by the pinch portion 29 to move downwardly from the pad surface of the suction pad 25, whereby a slit in the half-cut portion of the cut resin film 19 is widened to cause a crack.

Figure 10:
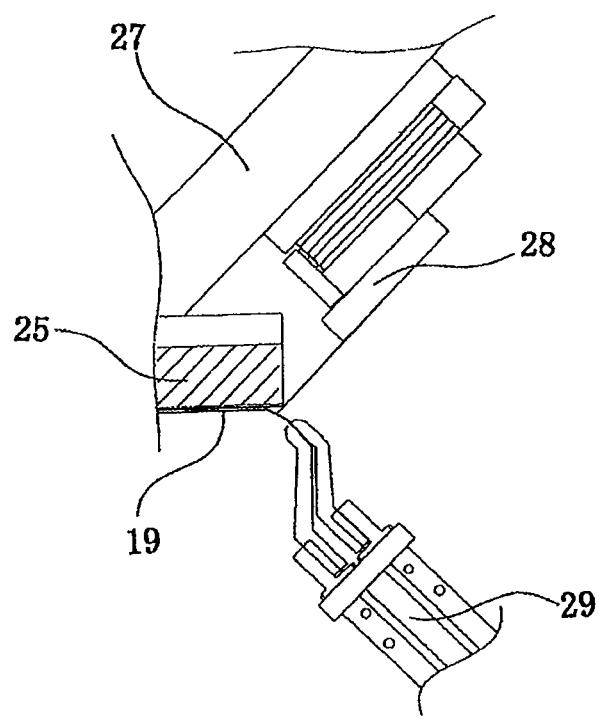
FIG. 10 is a partially enlarged illustration of the one embodiment.
Figure 11:
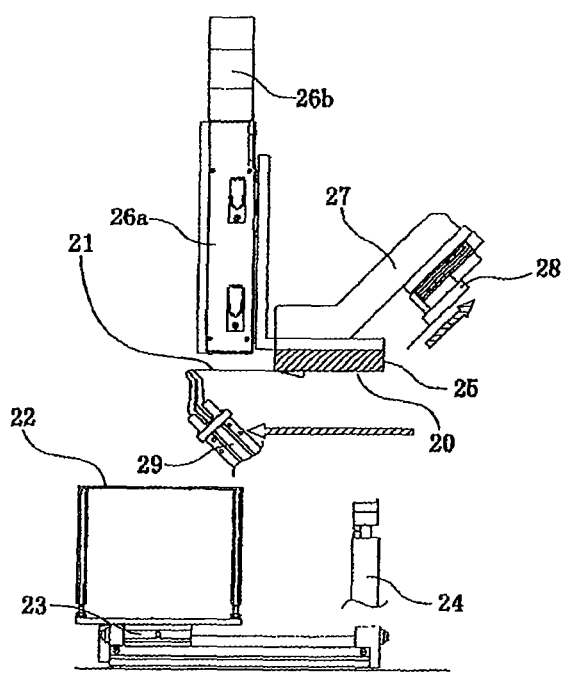
FIG. 11 is an illustration of the one embodiment.

Then, the pressing arm 24 moves downwardly. As shown in FIG. 10 which is a partially enlarged view of FIG. 9, the needle provided at the tip of the needle portion 28 pricks the slit in the half-cut portion to make the slit larger and easy to tear therefrom. In that state, the pinch portion 29 moves as indicated by an arrow in FIG. 11, whereby the support film 21 of the cut resin film 19 together with the end portion of the cut resin film 19 is removed from the resin film 20. The needle portion 28 returns to the original position. At this time, a major portion of the resin film 20 is left while being held on the suction pad 25 under suction. After the rest table 22 is moved to immediately under the suction pad 25, the suction pad 25 is moved downwardly, and the holding of the resin film 20 under suction is released, whereby the resin film 20 is placed on the rest table 22. The rest table 22 with the resin film 20 placed thereon is moved from immediately under the suction pad 25 to immediately under the suction plate 73a of the transfer arm 73. Then, the resin film 20 is transported to the provisionally laminated body forming block 4 by the transfer arm 73.

The provisionally laminated body forming block 4 (referring again to FIGS. 1 and 3) has the function of overlaying the aforementioned resin film 20 on an uneven surface of a substrate having protruding and recessed portions in a predetermined positional relationship to loosely attach the resin film 20 to the protruding portions of the uneven surface due to the viscosity of the resin film itself and due to its own weight, thereby forming a provisionally laminated body (PL1). This provisionally laminated body forming block 4 includes: the transfer arm 73 shared with the aforementioned support film removing block 3 and for moving the resin film 20 held by the suction plate 73a under suction to a predetermined position over an alignment table 30; a substrate ejection mechanism 74 for ejecting substrates 38 with uneven surfaces on a one-by-one basis, the substrates 38 being placed in multiple tiers within a substrate rack 33 movable upwardly and downwardly by a servomotor-driven LM actuator 33a; a guide rail 75 for guiding a substrate 38 ejected from the substrate rack 33 to the alignment table 30; a CCD camera module 76 for recognizing the contour lines of the substrate 38 and the resin film 20 held by the suction plate 73a under suction; an image recognition module not shown; and a SCARA robot 32 for transferring a provisionally laminated body (PL1) 31 including the substrate 38 and the resin film 20 attached to the uneven surface of the substrate 38 from the alignment table 30 to a transport film 34 in the end laminated body forming block 5 by holding the provisionally laminated body (PL1) 31 with a chuck.

Figure 12:
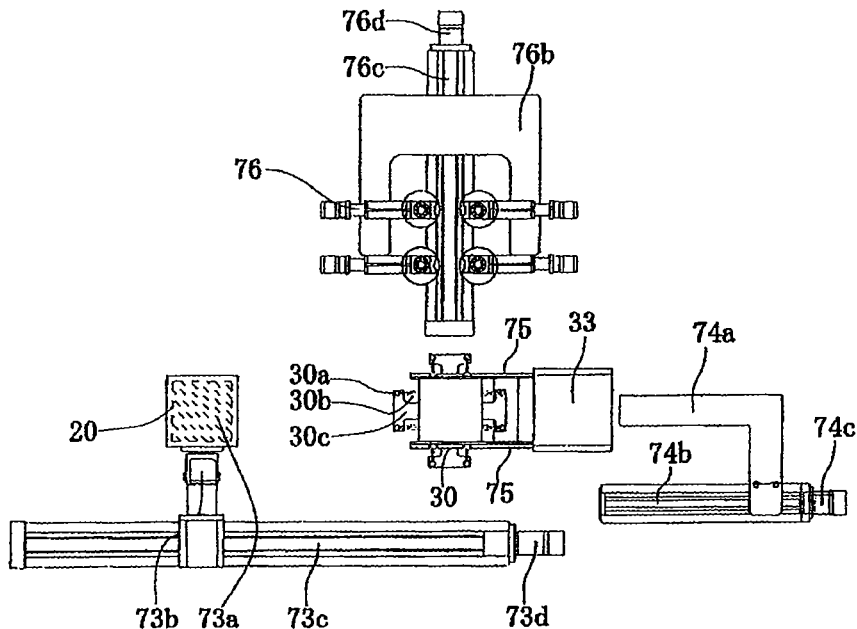
FIG. 12 is a partially enlarged illustration of the one embodiment.
Figure 13:
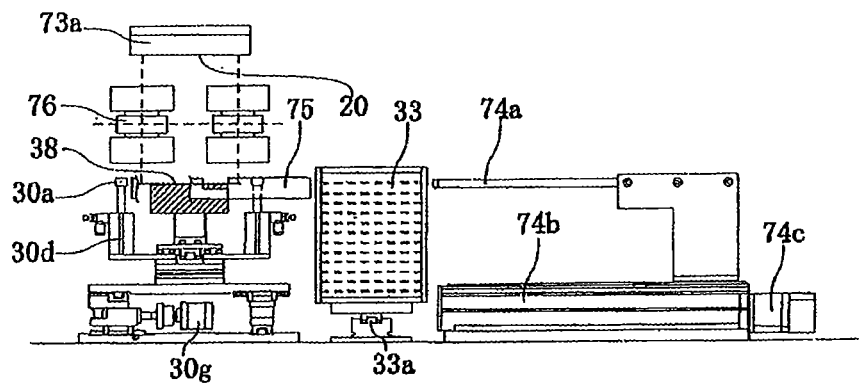
FIG. 13 is a partially enlarged illustration of the one embodiment.
Figure 14:
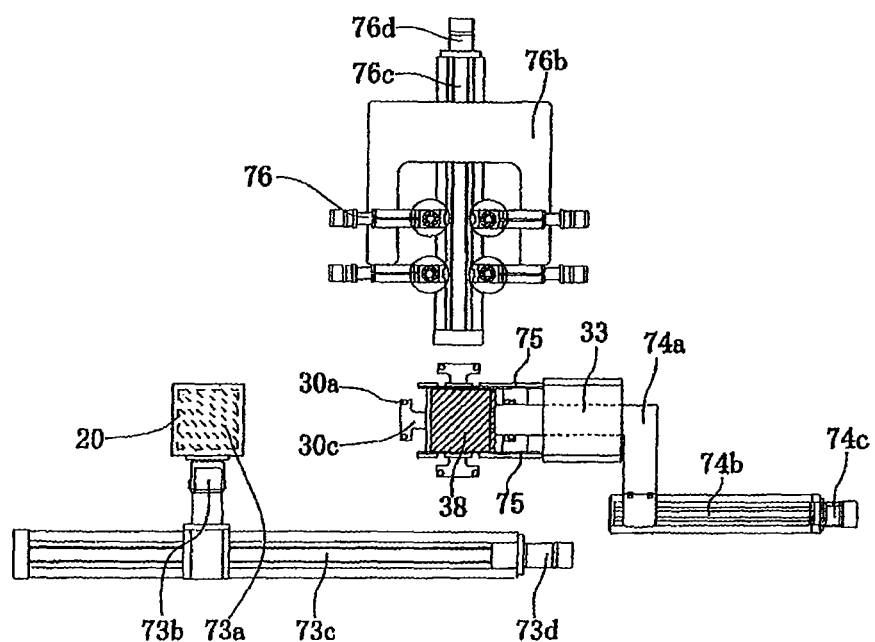
FIG. 14 is a partially enlarged illustration of the one embodiment.
Figure 15:
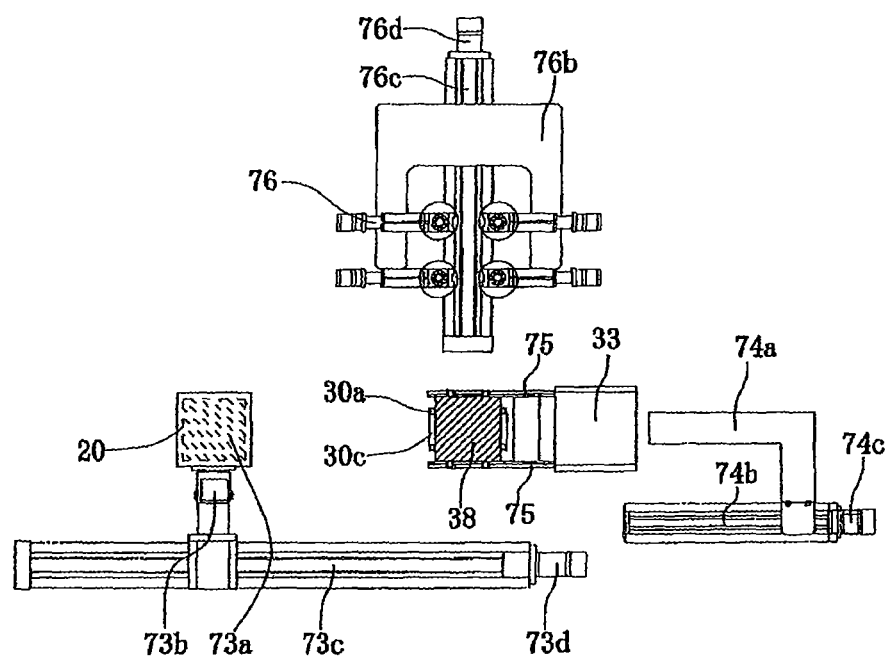
FIG. 15 is a partially enlarged illustration of the one embodiment.
Figure 33:
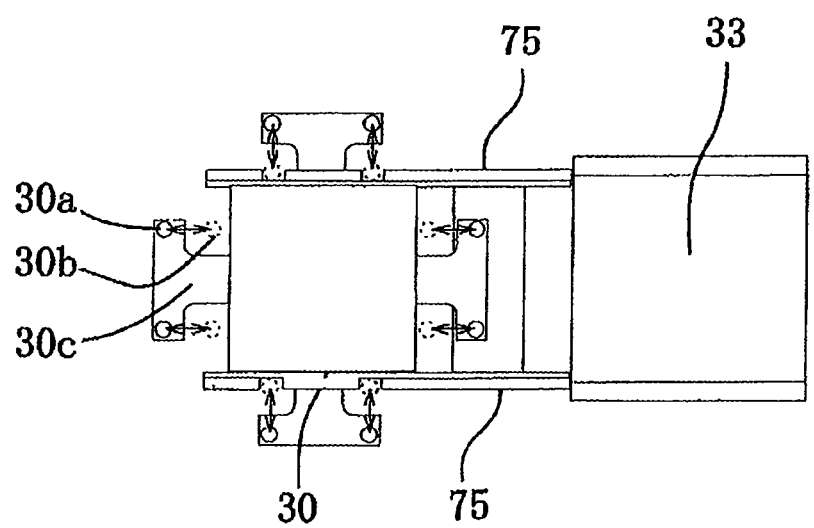
FIG. 33 is a partially enlarged illustration of FIG. 12.

In the aforementioned substrate ejection mechanism 74 in the position shown in FIG. 12 which is a partially enlarged view of FIG. 3, the rotary motion of a servomotor 74c is converted into a horizontal motion of a substrate ejection arm 74a by an LM actuator 74b. Using the force of this horizontal motion, the substrate ejection arm 74a ejects the substrates 38 stored in the substrate rack 33 on a one-by-one basis, as shown in FIG. 13 which is a partially enlarged view of the provisionally laminated body forming block 4 of FIG. 1. At this time, the height of the substrate rack 33 is controlled to a suitable height by the servomotor-driven LM actuator 33a so that a substrate 38 stored in the uppermost tier is ejected by the substrate ejection arm 74a. The substrate 38 ejected from the substrate rack 33 is moved while being supported by the guide rail 75, and is stopped substantially in the center of the alignment table 30. At this time, two centering rods 30a for each side of the alignment table 30 are lowered by an air cylinder 30d, and the substrate 38 slides over the lowered centering rods 30a (with reference to FIG. 14). When the substrate 38 is moved to substantially the center of the alignment table 30, the substrate ejection arm 74a slides back to the position shown in FIG. 12, and the centering rods 30a are moved upwardly in preparation for the centering of the substrate 38 so that the upper portions of the centering rods 30a are higher in vertical position than the substrate 38. On the other hand, the substrate rack 33 is upwardly moved by the servomotor-driven LM actuator 33a a distance corresponding to one tier of the storage space of the substrates 38 stored in multiple tiers, and is ready for the next substrate ejection. Then, centering bars 30c disposed in adjacent relation to the four sides of the alignment table and having the centering rods 30a mounted thereon slide to a predetermined position for the centering of the substrate 38 (the position indicated by dotted lines 30b in FIG. 12 and in FIG. 33 which is a partially enlarged view of FIG. 12), resulting in a condition shown in FIG. 15. As shown in FIG. 13, a notch is provided in the upper end of the guide rail 75 to prevent the centering rods 30a and the guide rail 75 from interfering with each other at this time. In this manner, the substrate 38 is centered in a predetermined position of the alignment table 30.

Figure 16:
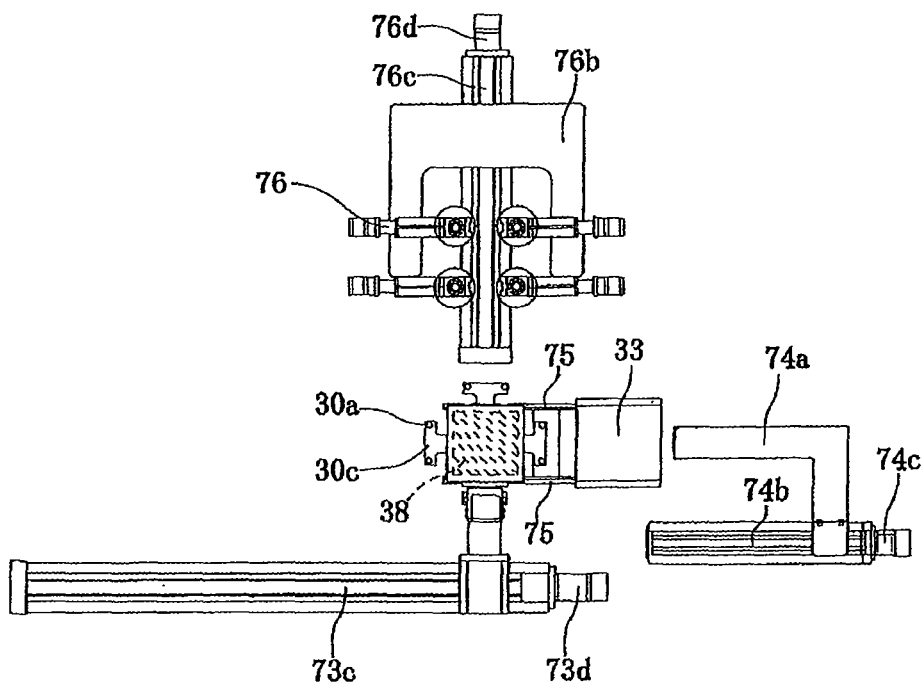
FIG. 16 is a partially enlarged illustration of the one embodiment.
Figure 17:
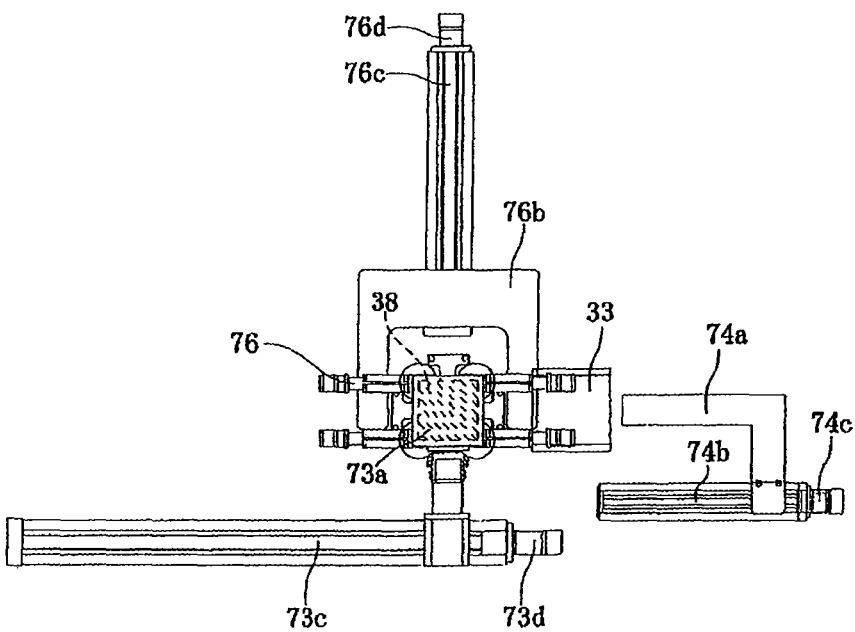
FIG. 17 is a partially enlarged illustration of the one embodiment.

Next, the aforementioned transfer arm 73 moves the suction plate 73a with the resin film 20 held on the back surface thereof under suction to over the substrate 38 centered by a horizontal transfer mechanism (the LM actuator 73b) and a horizontal transfer mechanism (the LM actuator 73c), so that the substrate 38 and the resin film 20 are in opposed relation, as shown in FIG. 16. Also, a CCD camera bar 76b on which four units of the CCD camera module 76 are mounted is moved horizontally into a space between the substrate 38 and the resin film 20 which are in opposed relation as mentioned above by an LM actuator 76c driven by a servomotor 76d, resulting in a condition shown in FIG. 17. A schematic cross-sectional view in this condition is shown in FIG. 13. As indicated by a horizontal dotted line in FIG. 13, the CCD camera module 76 mounted on the CCD camera bar 76b is in an intermediate position between the substrate 38 and the resin film 20 which are in opposed relation, and is configured so that the distances from the CCD camera module 76 to the substrate 38 and the resin film 20 are equal to the focal length of CCD cameras. These CCD cameras are capable of bringing the four corners of the substrate 38 and the resin film 20 into view by illuminating upward and downward or either upwardly or downwardly with prism shutters, as indicated by vertical dotted lines. Based on image information from the CCD cameras in this state, a computer is caused to recognize the contour lines of the substrate 38 and the resin film 20, thereby calculating the barycentric coordinates of the substrate 38 and the resin film 20.

Figure 18:
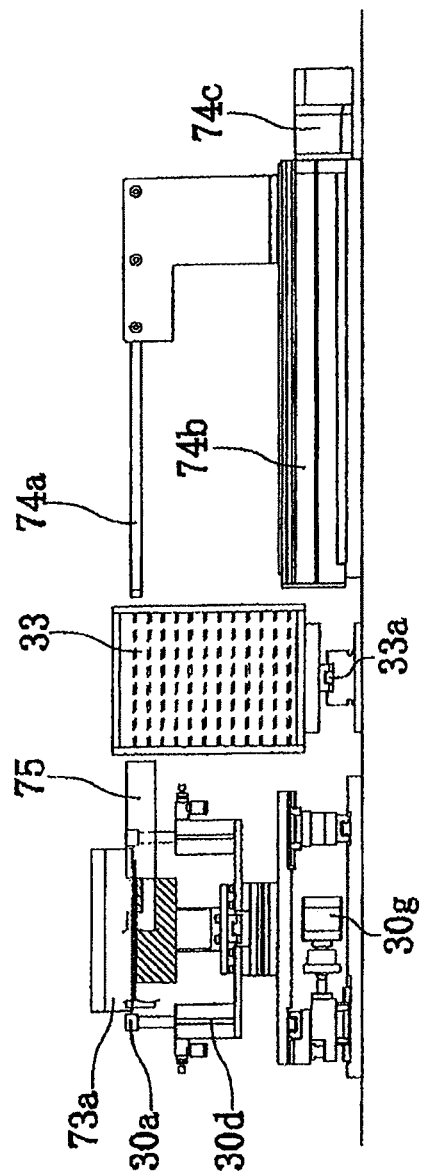
FIG. 18 is a partially enlarged illustration of the one embodiment.

Then, the alignment table 30 is moved in the X, Y and θ directions by a stepping motor 30g so that the barycentric coordinates of the substrate 38 and the resin film 20 coincide with each other. After the barycentric positions of the substrate 38 and the resin film 20 coincide with each other in the aforementioned process, the CCD camera bar 76b is retracted to the position shown in FIG. 16 and the suction plate 73a is lowered to the position shown in FIG. 18 for the purpose of producing the provisionally laminated body (PL1) 31. In that state, the sucking force of the suction plate 73a is stopped, and the resin film 20 is overlaid on the uneven surface of the substrate 38, so that the resin film 20 is loosely attached to the substrate 38. When both the front and back surfaces of the substrate 38 have protruding and recessed portions, the provisionally laminated body (PL1) 31 in which the resin film 20 is attached to one of the surfaces of the substrate 38 is initially produced. Then, this provisionally laminated body (PL1) 31 is flipped by a flipping mechanism not shown, and is placed again onto the alignment table 30. Then, the aforementioned process is repeated to attach the resin film 20 to the other surface. The chuck of the SCARA robot 32 holds and lifts the provisionally laminated body (PL1) 31 thus formed, and swivels around from that position. Then, after holding down the provisionally laminated body (PL1) 31 in a predetermined position, the chuck of the SCARA robot 32 stops grasping the provisionally laminated body (PL1) 31, and places the provisionally laminated body (PL1) 31 onto the transport film 34 so that provisionally laminated bodies (PL1) 31 are arranged in two lines on the transport film 34 (referring again to FIGS. 1 and 3). The transport film 34 operates intermittently in accordance with a depressurizing step and a pressurizing step in the end laminated body forming block 5 for the subsequent step. The transport film 34 is paid out from a starting end roller 42, and is wound on an ending end roller 43. This transport film 34 operates, with a plurality of (in this example, four) provisionally laminated bodies (PL1) 31 placed on the transport surface thereof, and sends the provisionally laminated bodies (PL1) 31 to the end laminated body forming block 5 for the next step.

Figure 19:
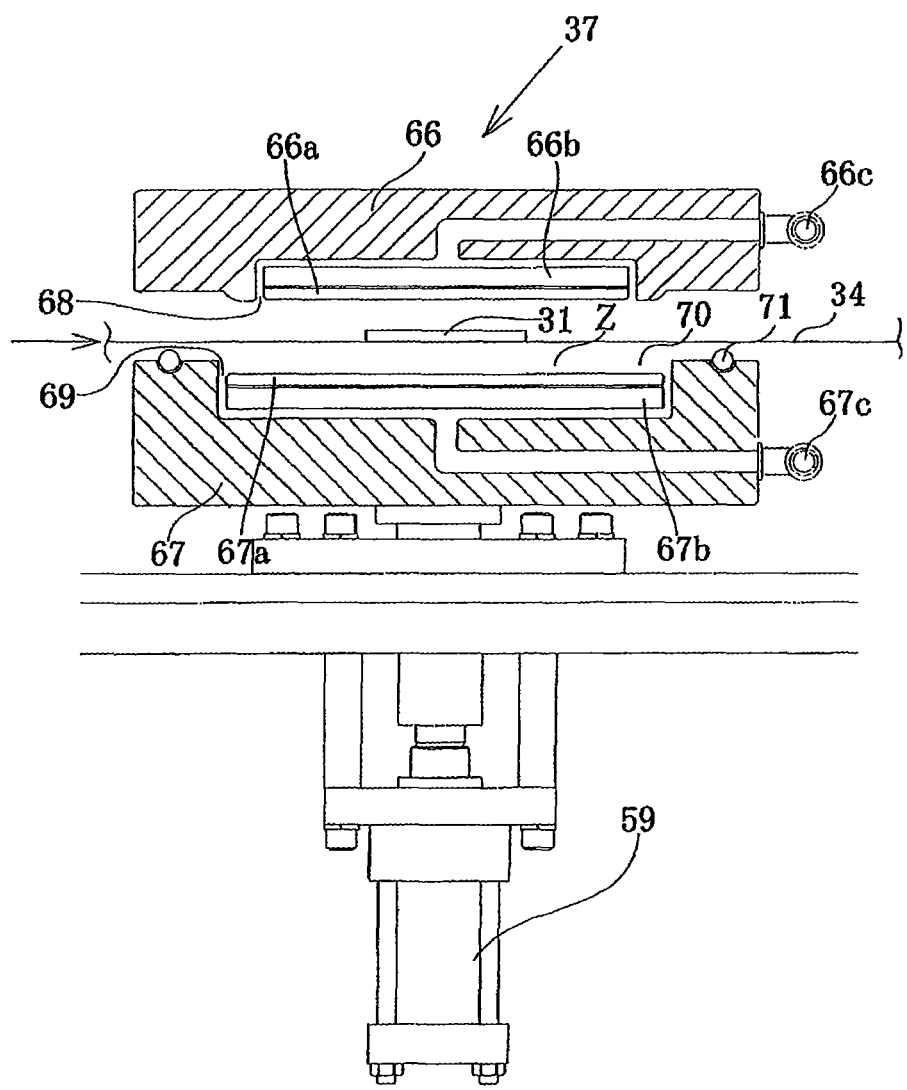
FIG. 19 is an illustration of the one embodiment.

The end laminated body forming block 5 is a characteristic part of the present invention, and includes: an enclosed space forming means capable of receiving the provisionally laminated body (PL1) 31 therein; and a pressure laminating means (P1) for applying pressure to the provisionally laminated body (PL1) in non-contacting relationship in this enclosed space to form an end laminated body (a laminating mechanism (E1)). As shown in FIG. 1, a depressurizing and pressurizing tank 37 capable of freely switching between depressurization and pressurization is used in this embodiment as the enclosed space forming means for changing the provisionally laminated body (PL1) 31 into an end laminated body 36. As shown in FIG. 19, this depressurizing and pressurizing tank 37 includes an upper plate portion 66 and a lower plate portion 67. The upper plate portion 66 has a lower metal plate surface which is cut to define a recess. A rectangular heater plate 66a is provided in this recessed portion of the upper plate portion 66, with a thermal insulation board 66b therebetween. A connection port 66c is connected to a vacuum suction device and the like not shown (for example, a vacuum suction device, a vacuum regulator, atmosphere inlet piping, an air pressurizing device, and the like). An air intake and supply channel 68 is provided around the outer periphery of the heater plate 66a. Like the upper plate portion 66, the lower plate portion 67 has an upper metal plate surface which is cut to define a recess. A rectangular heater plate 67a is provided in a recess 70 which is this recessed portion of the lower plate portion 67, with a thermal insulation board 67b therebetween. In the aforementioned manner, a connection port 67c is connected to a vacuum suction device and the like not shown (for example, a vacuum suction device, a vacuum regulator, atmosphere inlet piping, an air pressurizing device, and the like), and an air intake and supply channel 69 is provided around the outer periphery of the aforementioned heater plate 67a. The connection port need not be provided for each of the upper and lower plates as mentioned above, but may be provided for only one of the upper and lower plates. A recessed channel is provided in the upper surface of the lower plate portion 67 so as to surround the heater plate 67a. A seal material 71 including an O-ring and the like is disposed in the recessed channel. The lower plate portion 67 is movable upwardly and downwardly by a hydraulic cylinder 59. The lower plate portion 67 is moved upwardly from the position shown into intimate contact with the upper plate portion 66, with the seal material 71 therebetween. When the lower plate portion 67 and the upper plate portion 66 are in intimate contact with each other, the aforementioned recess 70 becomes an enclosed space Z. The provisionally laminated body (PL1) 31 is subjected to the step of depressurization and the step of pressurization in non-contacting relationship by means of the pressure laminating means (P1) within this enclosed space Z to become the end laminated body 36.

These steps will be described in detail by taking as an example an instance in which a substrate obtained by providing surface-mount light-emitting elements disposed in predetermined spaced apart relation and serving as protruding portions 38c on a board 38b including an insulated substrate and a conductor pattern, with recessed portions 38d defined between the protruding portions 38c, is used as the substrate 38 having protruding and recessed portions, and in which the provisionally laminated body (PL1) 31 such that the resin film 20 is overlaid on the uneven surface of the substrate 38 is formed into the end laminated body 36. The provisionally laminated body (PL1) 31 placed on the transport film 34 is transported as indicated by an arrow in FIG. 19, and is positioned between the upper plate portion 66 and the lower plate portion 67 so as to be in face-to-face relation to the recess 70 for the enclosed space Z. The provisionally laminated body (PL1) 31 in this position is in such a condition that the resin film 20 is overlaid on the uneven surface of the substrate 38 and is loosely attached to the upper surfaces of the protruding portions 38c. The pipes between the connection port 66c or 67c of the depressurizing and pressurizing tank 37 and the vacuum suction device are closed by valves (not shown). With the pipes between the connection ports (66c and 67c) and the vacuum suction device closed by the valves, the hydraulic cylinder 59 operates to move upwardly to bring the upper plate portion 66 and the lower plate portion 67 into abutment with each other, with the seal material 71 therebetween, so that the recess 70 of the lower plate portion 67 becomes the enclosed space Z. At this time, the provisionally laminated body (PL1) 31 is in contact with neither the upper plate portion 66 nor the lower plate portion 67. With the enclosed space Z formed, the valves between the vacuum suction device (not shown) and the connection ports 66c and 67c are opened, so that vacuum suctioning within the enclosed space Z is performed. At the same time, the provisionally laminated body (PL1) 31 is heated by the upper and lower heater plates 66a and 67a previously controlled at a predetermined temperature. Then, since the provisionally laminated body (PL1) 31 is heated under a reduced pressure, the resin film 20 of the provisionally laminated body (PL1) 31 is softened to fit the protruding and recessed portions of the substrate 38. Further, the entire perimeter of the edges of the resin film 20 adheres to the entire perimeter of the peripheral portion of the surface of the substrate 38. This creates an enclosed space (S) between the resin film 20 and the substrate 38 to form a provisionally laminated body (PL2) (72) having the enclosed space (S). At this time, the aforementioned enclosed space (S), like the enclosed space Z therearound, is in a depressurized condition. It should be noted that the reference characters within parentheses are not shown. The same holds true for reference characters within parentheses to be described below.

After the provisionally laminated body (PL2) (72) having the enclosed space (S) is formed, the depressurized condition of the aforementioned enclosed space Z is decreased while the heating of the heater plates 66a and 67a are maintained, whereby a stepwise or continuously high air pressure condition is achieved. Specifically, the end laminated body forming block 5 has a control function of controlling applied pressure, such as operating a vacuum regulator to control the air pressure in the aforementioned enclosed space Z to an air pressure intermediate between a vacuum and atmospheric pressure, or stopping the vacuum suction of the upper plate portion 66 and the lower plate portion 67 and then introducing the atmosphere into the aforementioned enclosed space Z, and further introducing a pressurized gas such as compressed air into the aforementioned enclosed space Z, as required. Thus, controlled pressure and heat are applied to the provisionally laminated body (PL2) (72). At this time, the enclosed space (S) between the resin film 20 and the substrate 38 of the provisionally laminated body (PL2) (72) is in the depressurized condition as stated above. While this enclosed space (S) is maintained, the enclosed space Z in the depressurizing and pressurizing tank 37 is brought into a pressurized condition. This creates a difference in air pressure between these spaces (the enclosed space Z and the enclosed space (S)). This created air pressure difference causes the resin film 20 of the provisionally laminated body (PL2) (72) to be forced hard from outside into intimate contact with the substrate 38 in such a condition that the resin film 20 completely fits the protruding and recessed portions of the substrate 38. Then, the aforementioned heating rigidly attaches the resin film 20 to the substrate 38 in such a condition that the resin film 20 completely fits the protruding and recessed portions of the substrate 38, so that the end laminated body 36 is formed.

The end laminated body 36 formed in this manner is sent out of the depressurizing and pressurizing tank 37 by the intermittent operation of the transport film (with reference to FIG. 3).

Next, the operation of laminating the substrate and the resin film together by using the laminating apparatus A according to the aforementioned embodiment will be described sequentially.

In the cutting block 1 (with reference to FIG. 2), the resin film with the support film and with the cover film is sent from the unwind roll 6 in the direction of an arrow, and the cover film is removed from the resin film with the support film by part of the removal plate d, whereby separation between the cover film and the resin film with the support film is achieved. The removed cover film is wound and stored on the take-up roll 7. On the other hand, the resin film with the support film is cut to a predetermined size by the disc cutter 8 to become the cut resin film 19. The cut resin film 19 is transported by the transport conveyor 11 to the subsequent precure block 2.

In the precure block 2, the cut resin film 19 is precured. Specifically, the cut resin film 19 on the transport conveyor 11 is heated by circulating high-temperature air produced by the blower fan 12*a* and the duct heater 12*b* which are provided under the transport conveyor 11 so as to be semi-hardened (B-staged) to such a degree as to have self shape retention during the heating in the depressurizing and pressurizing tank 37. The precured cut resin film 19 is transported by the transport conveyor 11 to the subsequent support film removing block 3.

In the support film removing block 3, the operation of removing the support film 21 from the precured cut resin film 19 is performed by the half cutting device 13 and the support film removing device 14. First, the precured cut resin film 19 is transferred onto the mounting pad 18 of the half cutting device 13, and a cut (half cut) is made in the cut resin film 20 and an upper portion of the support film 21 by the cutting edge 15 (with reference to FIGS. 4A and B). This portion in which a cut is made is referred to as a half cut point. Next, the cut resin film 19 subjected to the half cut is held under suction by the suction pad 25 of the arm 27 of the support film removing device 14 (with reference to FIG. 7). Part of the cut resin film 19 protruding from the suction pad 25 (an end portion near the half cut point) is grasped by the pinch portion 29 and pulled toward the opposite end portion of the cut resin film 19 (with reference to FIG. 11), whereby the resin film 20 of the cut resin film 19 is cut at the half cut point. The support film 21 is removed from the end portion forward of the half cut point, and only the resin film 20 remains on the suction pad 25. The remaining resin film 20 is sent to the subsequent provisionally laminated body forming block 4 (with reference to FIG. 1).

In the provisionally laminated body forming block 4, one of the substrate 38 stored in the substrate rack 33 which lies in the uppermost tier is ejected onto the alignment table 30 by the substrate ejection mechanism 74. The resin film 20 held under suction by the suction plate 73*a* of the transfer arm 73 is brought into opposed relation to the substrate 38 on the alignment table 30, and the barycentric positions of the substrate 38 and the resin film 20 are cause to coincide with each other. Thereafter, the holding of the resin film 20 under suction by the suction plate 73*a* is released, and the resin film 20 is overlaid on the substrate 38, whereby the provisionally laminated body (PL1) 31 is formed. The formed provisionally laminated body (PL1) 31 is transferred onto the transport film 34 by the SCARA robot 32, and is sent to the subsequent end laminated body forming block 5.

The provisionally laminated body (PL1) 31 sent to the end laminated body forming block 5 is positioned in the enclosed space Z (with reference to FIG. 19) of the depressurizing and pressurizing tank 37, and is initially subjected to a depressurizing process while being heated. Thus, the resin film 20 of the provisionally laminated body (PL1) 31 is softened and can no longer maintain the sheet-like shape because the support film 21 has already been removed therefrom. As a result, the resin film 20 fits the protruding and recessed port ions of the substrate 38. As the heating and the depressurizing process proceed, the entire perimeter of the edges of the resin film 20 adheres to the entire perimeter of the peripheral portion of the surface of the substrate 38. The provisionally laminated body (PL1) 31 hence becomes the provisionally laminated body (PL2) (72) in which the enclosed space (S) in the depressurized condition is created between the resin film 20 and the substrate 38. Next, the depressurized condition in the enclosed space Z of the depressurizing and pressurizing tank 37 is cancelled. The pressure in the enclosed space Z is changed to atmospheric pressure, and is further increased. This applies pressure to the enclosed space Z which receives the provisionally laminated body (PL2) (72) therein. As a result, a difference in air pressure is created between these spaces (the enclosed space Z and the enclosed space (S)). This created air pressure difference causes the resin film 20 softened by heating to fit and come into intimate contact with the protruding and recessed portions of the substrate 38, thereby rigidly attaching the resin film 20 to the substrate 38. In other words, the resin film 20 is laminated to the substrate 38 in non-contacting relationship with any portion of the depressurizing and pressurizing tank 37 without the creation of microvoids between the resin film 20 and the substrate 38. In this manner, the end laminated body 36 is formed from the provisionally laminated body (PL1) 31.

In this manner, the laminating apparatus A according to this embodiment laminates the resin film 20 along the protruding and recessed portions of the substrate 38 in non-contacting relationship. Thus, if the degree of protruding and recessed portions of the substrate 38 is relatively large as in a wiring circuit board with an optical semiconductor element mounted thereon or if the degree of protruding and recessed portions of the substrate 38 is small and the spacings between the protruding and recessed portions are small, the laminating apparatus A allows the resin film to sufficiently conform to the substrate, thereby laminating the resin film and the substrate together without the creation of microvoids. Also, the laminating apparatus A is capable of causing the film thickness of the resin film 20 conforming to the substrate having the protruding and recessed portions to be a uniform thickness on a stricter level. This laminating apparatus A achieves savings in space during the installation of the apparatus because depressurization and pressurization are carried out by the same apparatus. It should be noted that this laminating apparatus A is useful not only for sealing of typical printed boards but also for other applications, and is in particular useful for sealing of LED boards and PDP boards.

In the aforementioned embodiment, the transport film 34 (with reference to FIG. 1) is used to transport the provisionally laminated body (PL1) 31. However, the transport may be, for example, as follows. The lower plate portion 67 of the depressurizing and pressurizing tank 37 of FIG. 19 in the end laminated body forming block 5 is made leftwardly and rightwardly slidable and is slid leftwardly from the position shown in FIG. 1. The provisionally laminated body (PL1) 31 is directly set on the slidable lower plate portion 67 by using the SCARA robot 32, and the lower plate portion 67 is returned to a predetermined position. Similarly, the end laminated body 36 may be taken out in the following manner. The lower plate portion 67 of the depressurizing and pressurizing tank 37 is slid rightwardly as seen in FIG. 1, and another SCARA robot is used to directly take out the end laminated body 36. This eliminates the need for the space for installation of the transport film 34 to make efficient use of the installation space of the apparatus, thereby achieving savings in space. Also, the need for the transport film and costs for discarding the same is also eliminated. This also achieves reduction in costs.

In the laminating apparatus A according to the aforementioned embodiment, depressurization and pressurization are carried out by using the same depressurizing and pressurizing tank 37 for the formation of the end laminated body 36. However, a depressurizing tank and a pressurizing tank may be separately disposed upstream and downstream in succession, so that depressurization and pressurization are shared by the tanks. Unlike the single depressurizing and pressurizing tank, the depressurizing tank and the pressurizing tank provided separately in this manner reduce losses of time for switching between depressurization and pressurization to achieve the increased efficiency of manufacture.

The depressurizing process is performed on the provisionally laminated body (PL1) 31 in the end laminated body forming block 5 in the laminating apparatus A according to the aforementioned embodiment. However, the depressurizing process need not necessarily be performed, depending on the degree of flexibility of the resin film 20 and the conditions of the pressurizing process. It is, however, preferable to perform the depressurizing process which have a tendency to provide an end laminated body having a higher degree of intimate contact.

Further, a pressure laminating means (P3) for attaching (laminating) the periphery of the resin film 20 to the substrate 38 by the use of the flexibility and adhesion of the resin film 20 which are increased by the heating treatment is used for the formation of the provisionally laminated body (PL2) (72) having the enclosed space (S) in the end laminated body forming block 5 in the laminating apparatus A according to the aforementioned embodiment. Alternatively, a frame-shaped pressing means for positively attaching (laminating) the periphery of the resin film 20 to the substrate 38 may be provided in the depressurizing and pressurizing tank 37 and be moved upwardly and downwardly by a support arm to press the periphery of the resin film. This shortens the time required for the formation of the provisionally laminated body (PL2) (72), and also ensures the hermeticity of the provisionally laminated body (PL2) (72), thereby improving the intimate contact between the resin film 20 and the substrate 38 during the formation of the end laminated body 36. The periphery of the resin film can be attached to the substrate without the heating treatment for the formation of the provisionally laminated body (PL2) (72), depending on the type of the resin film. In such a case, the heating treatment need not necessarily be performed.

Figure 34:
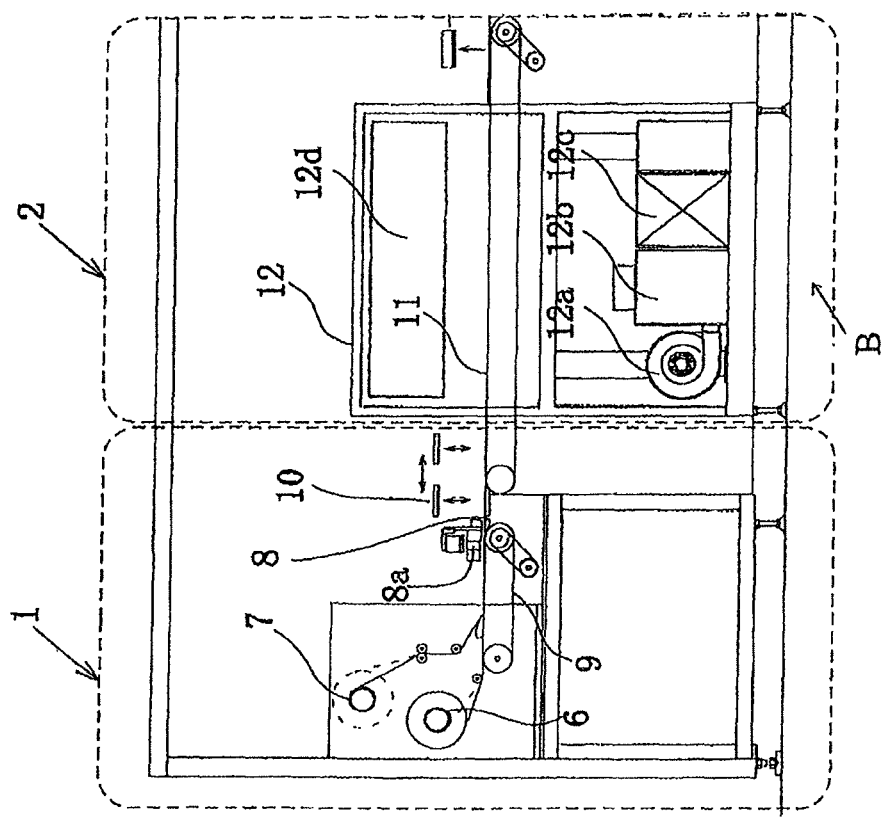
FIG. 34 is a partially enlarged illustration of FIG. 21.
Figure 35:
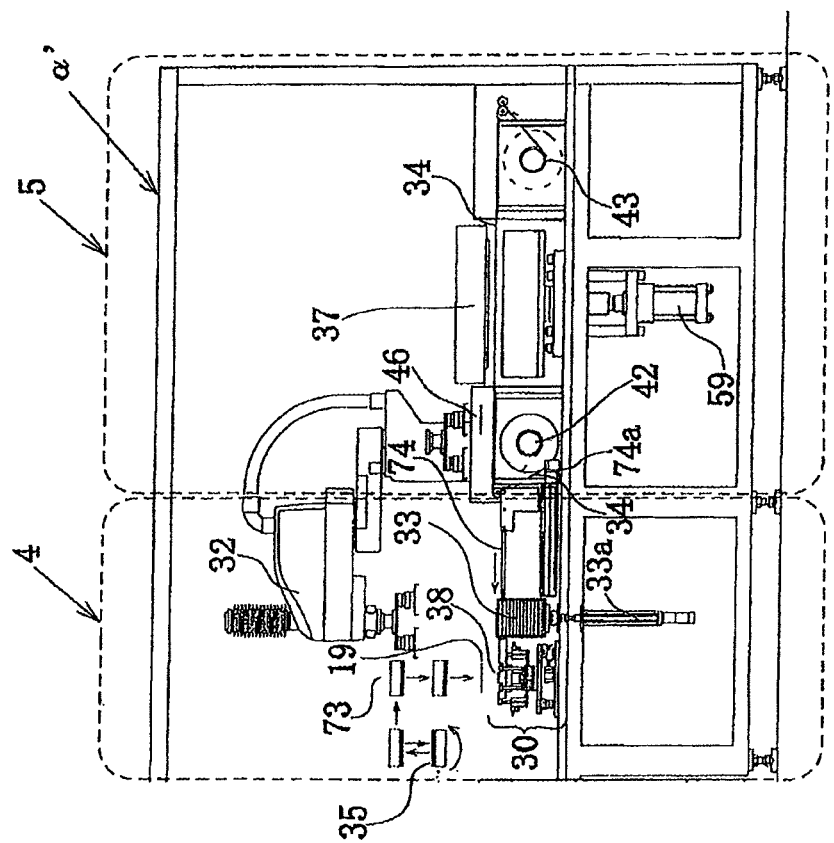
FIG. 35 is a partially enlarged illustration of FIG. 21.

Next, a laminating apparatus B according to another embodiment of the present invention is shown in FIG. 21, and partially enlarged views of FIG. 21 are shown in FIG. 34 (the blocks 1 and 2) and in FIG. 35 (the blocks 4 and 5). This laminating apparatus B is such that the support film removing block 3 in the laminating apparatus A (with reference to FIG. 1) of the aforementioned embodiment is dispensed with. Specifically, the laminating apparatus A includes the support film removing block 3 for removing the support film 21 from the cut resin film 19 (the resin film with the support film). However, if the degree of protruding and recessed portions of the substrate 38 is relatively small, the support film 21 need not be removed, but may be laminated to the substrate 38 while being attached to the resin film 20, so that a provisionally laminated body (PL1) 46 or a provisionally laminated body (PL2) (81) is formed. This provisionally laminated body (PL1) 46 or the provisionally laminated body (PL2) (81) is pressurized in non-contacting relationship, whereby an end laminated body (93) is provided. In this case, the need for the aforementioned support film removing block 3 is hence eliminated.

Parts of this laminating apparatus B are identical with those of the laminating apparatus A as mentioned above except that the support film removing block 3 is dispensed with. Identical parts are designated by like reference numerals and characters, and will not be described. The laminating apparatus B further includes a suction-plate-equipped flipping table 35. The suction-plate-equipped flipping table 35 has the function of flipping the precured cut resin film 19 to hold the support film 21 surface of the cut resin film 19 under suction on the suction plate 73a of the transfer arm 73. This allows the substrate 38 to be in opposed relation to the resin film 20 surface of the cut resin film 19 on the alignment table 30. This laminating apparatus B produces effects similar to those of the laminating apparatus A, and is reduced in size as compared with the laminating apparatus A because the laminating apparatus B does not include the support film removing block 3.

Figure 22:
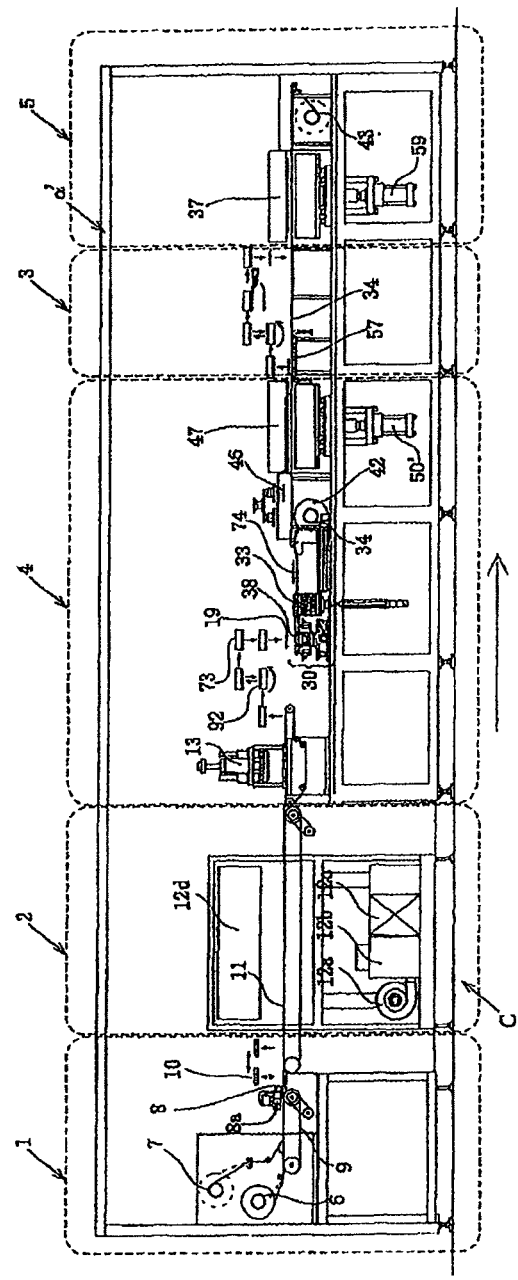
FIG. 22 is a sectional view of a further embodiment of the present application.
Figure 36:
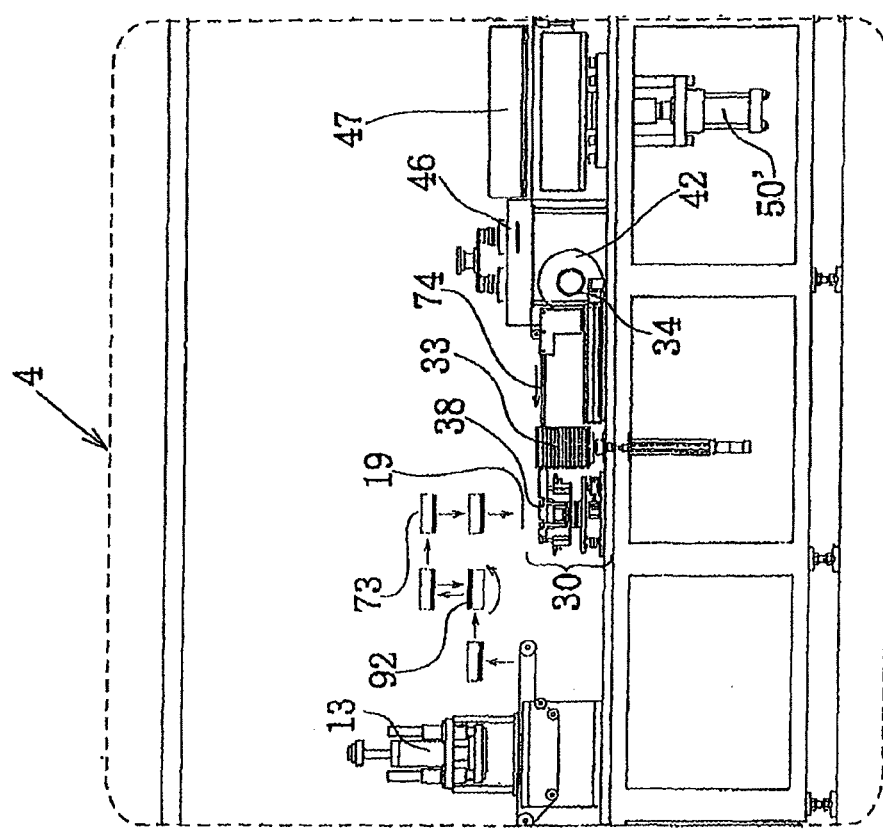
FIG. 36 is a partially enlarged illustration of FIG. 22.
Figure 37:
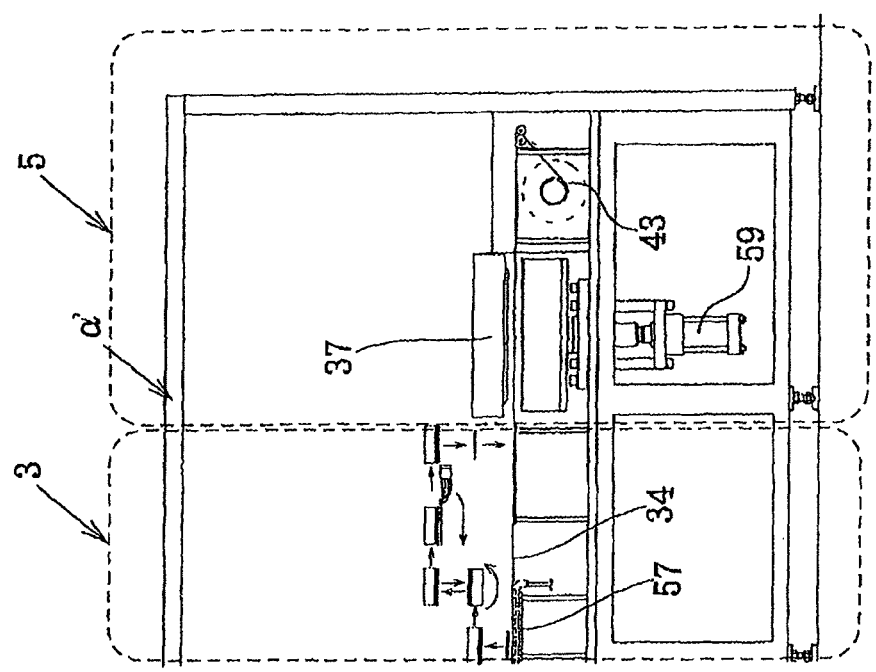
FIG. 37 is a partially enlarged illustration of FIG. 22.

A laminating apparatus C according to a further embodiment of the present invention is shown in FIG. 22, and partially enlarged views of FIG. 22 are shown in FIG. 36 (the blocks 1 and 2) and in FIG. 37 (the blocks 3 and 5). This laminating apparatus C shows a modification of the removal of the support film 21 in the support film removing block 3 in the aforementioned laminating apparatus A (with reference to FIG. 1). The laminating apparatus C has a depressurizing function of placing the space between the resin film 20 with the support film 21 and the substrate 38 of the provisionally laminated body (PL1) in the enclosed space Z under a negative pressure, a heating function of heating the provisionally laminated body (PL1), and a pressure laminating means (P2) of forming a provisionally laminated body (PL1) or a provisionally laminated body (PL2) in which the substrate 38 and the resin film 20 with the support film 21 of the provisionally laminated body (PL1) are integrated together (a laminating mechanism (E2)). Specifically, this laminating apparatus C forms the provisionally laminated body (PL1) 46 or the provisionally laminated body (PL2) (81), with the support film 21 attached to the resin film 20, and thereafter removes the support film 21 to form an end laminated body (94). The laminating apparatus C includes the cutting block 1, the precure block 2, the provisionally laminated body forming block 4, the support film removing block 3, and the end laminated body forming block 5, which in turn are disposed in the order named from upstream (the cutting block 1) to downstream (the end laminated body forming block 5) in the flow direction indicated by the arrow, as shown. It should be noted that SCARA robot 32 and the like are not shown in FIGS. 22, 36 and 37.

Of these, the cutting block 1 and the precure block 2 are substantially similar in construction to those of the aforementioned laminating apparatus A. Identical or corresponding parts in the blocks 1 and 2 are designated by like reference numerals and characters, and will not be described.

The provisionally laminated body forming block 4 in this laminating apparatus C includes a flipping mechanism 92 for flipping the cut resin film 19 subjected to the half cut in the half cutting device 13 so that the support film 21 is positioned upside and the resin film 20 is positioned downside (with reference to FIG. 36). Then, the cut resin film 19 is overlaid on the uneven surface of the substrate 38 and is attached thereto to provide the provisionally laminated body (PL1) 46. When the substrate 38 has protruding and recessed portions on the opposite surfaces thereof, the provisionally laminated body (PL1) in which the cut resin film 19 is attached to each of the opposite surfaces of the substrate 38 is formed by initially attaching the cut resin film 19 so that the resin film 20 surface is in contact with one of the surfaces of the substrate 38, thereafter flipping the substrate 38, and repeating the aforementioned operation on the other surface of the substrate 38. The aforementioned provisionally laminated body (PL1) 46 is placed on the transport film 34, and is transported into a contact laminating device 47 (with reference to FIG. 23). This contact laminating device 47 expands an upper flexible sheet 48 like a kind of balloon, and uses the expansive force for pressurization and lamination. The aforementioned provisionally laminated body (PL1) 46 is subjected to a contact lamination process by the contact laminating device 47 to become the provisionally laminated body (PL1) 46 in which the substrate 38 and the resin film 20 with the support film 21 are integrated together (a pressure laminating means (P2)).

Figure 23:
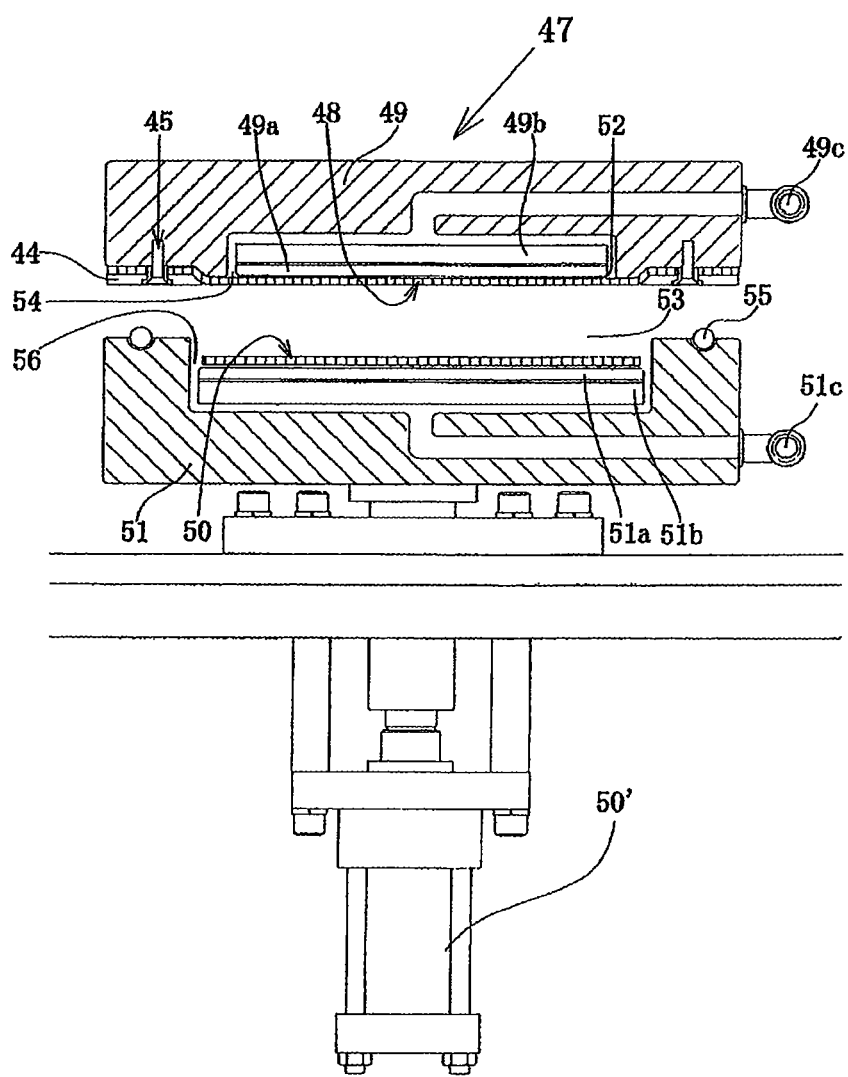
FIG. 23 is an illustration of the further embodiment.

As shown in FIG. 23, the aforementioned contact laminating device 47 includes an upper plate portion 49 and a lower plate portion 51. The upper plate portion 49 has a lower metal plate surface which is cut to define a recess. A rectangular heater plate 49a is provided in this recessed portion of the upper plate portion 49, with a thermal insulation board 49b therebetween. The upper flexible sheet 48 is mounted to the upper plate portion 49. Like the upper plate portion 49, the lower plate portion 51 is formed by a metal plate. A rectangular heater plate 51a is provided in a recess formed in the upper metal plate surface of the lower plate portion 51, with a thermal insulation board 51b therebetween. A lower elastic sheet 50 is mounted to the lower plate portion 51. The upper plate portion 49 is switchably connectable to an air pressurization device (not shown) and to a vacuum suction device (not shown). When pressure is applied through an opening channel 54 and a piping connection port 49c to a gap portion 52 between the upper plate portion 49 and the upper flexible sheet 48, the upper flexible sheet 48 is expanded like a balloon toward the lower plate portion 51. In FIG. 23, the reference numeral 44 designates a frame-shaped stop plate for the flexible sheet, and 45 designates a stopper therefor. On the other hand, the lower plate portion 51 is connected to the vacuum suction device (not shown), and is moved upwardly by a hydraulic cylinder 50' into abutment with the upper plate portion 49, thereby forming an enclosed space 53 between the upper plate portion 49 and the lower plate portion 51, with a seal material 55 therebetween.

When the depressurization through the piping connection port 49c of the upper plate portion 49 is stopped and air is supplied while the provisionally laminated body (PL1) 46 in which the resin film 20 with the support film 21 is attached to the aforementioned substrate 38 is vacuum suctioned within the enclosed space 53 through an opening channel 56 and a piping connection port 51c of the lower plate portion 51 and through the opening channel 54 and the piping connection port 49c of the upper plate portion 49, the upper flexible sheet 48 of the upper plate portion 49 is pressure-expanded toward the enclosed space 53 because of a difference in air pressure between the gap portion 52 and the enclosed space 53. This expanded upper flexible sheet 48 causes the clamping (lamination) of the substrate 38 and the cut resin film 19 with the support film 21 together. The lower elastic sheet 50 has the function of efficiently transmitting the pressure from the expanded upper flexible sheet 48 to the substrate and to the cut resin film 19 with the support film 21. This contact lamination process causes the provisionally laminated body (PL1) 46 in which the substrate 38 and the cut resin film 19 with the support film 21 are initially loosely attached to each other to become the provisionally laminated body (PL1) 46 in which the cut resin film 19 with the support film 21 is firmly attached by pressure and fixed to the protruding surface of the substrate 38 so that the cut resin film 19 with the support film 21 and the substrate 38 are integrated together. It should be noted that the aforementioned contact lamination process is performed for the purpose of integrating the aforementioned cut resin film 19 and the substrate 38 together, and does not necessarily provide the enclosed space (S) between the cut resin film 19 and the substrate 38. However, the contact lamination process may be adapted to provide the provisionally laminated body (PL2) (81) including the enclosed space (S). The provision of the provisionally laminated body (PL2) (81) in this step shortens the time required in the end laminated body forming block 5 to be described later. Also, the aforementioned cut resin film 19, which has the support film 21 and is low in conformability and in flexibility, does not fit the protruding and recessed portions of the substrate 38 so tightly by the aforementioned contact lamination process, but is held relatively flat.

Figure 24:
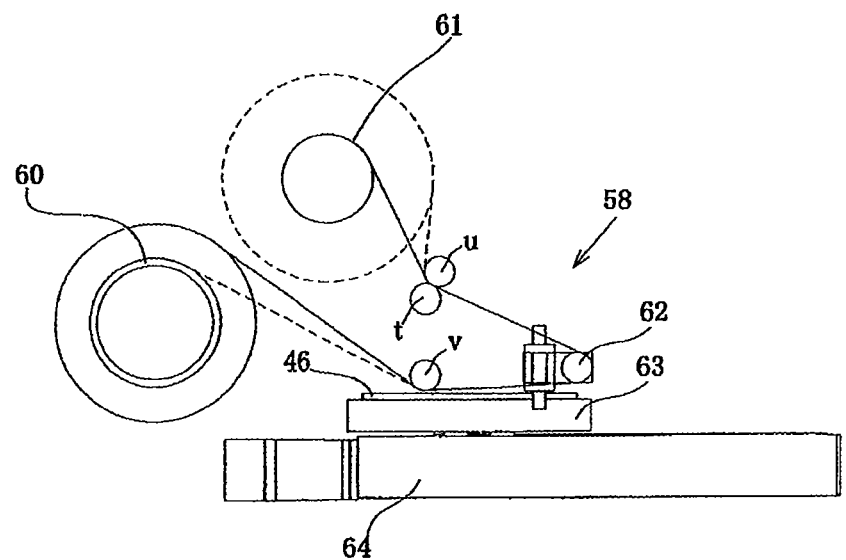
FIG. 24 is a partially enlarged illustration of the further embodiment.

The transport film 34 which places thereon and transports provisionally laminated bodies (PL1) 46 each subjected to the contact lamination process so that the substrate 38 and the resin film 20 with the support film 21 are integrated together stops moving temporarily when the provisionally laminated bodies (PL1) 46 come to over a cooling plate 57 of a water cooling type, as shown in FIG. 22. Thus, the provisionally laminated bodies (PL1) 46 are cooled by the cooling plate 57. After the cooling, the provisionally laminated bodies (PL1) 46 are sent on a one-by-one basis to the support film removing block 3 by a SCARA robot not shown. The resin film 20 is prevented from being stretched and broken during the removal of the support film 21 because the aforementioned provisionally laminated bodies (PL1) 46 are cooled. The support film removing block 3 includes a support film removing device 58. As shown in FIG. 24, this support film removing device 58 includes an unwind roll 60 for unwinding a removal tape for adhering to the support film 21 to remove the support film 21, nip rolls t and u and a take-up roll 61 with a driving device (not shown) for winding up the support film 21 together with the removal tape, a pressure roll 62 for bringing the removal tape into pressure contact with the support film in a predetermined position, and a suction table 63 horizontally movable by a servomotor-driven LM actuator 64 and for holding the provisionally laminated body (PL1) 46 under suction. In the figure, the reference character v designates a guide roll for the removal tape.

Figure 25:
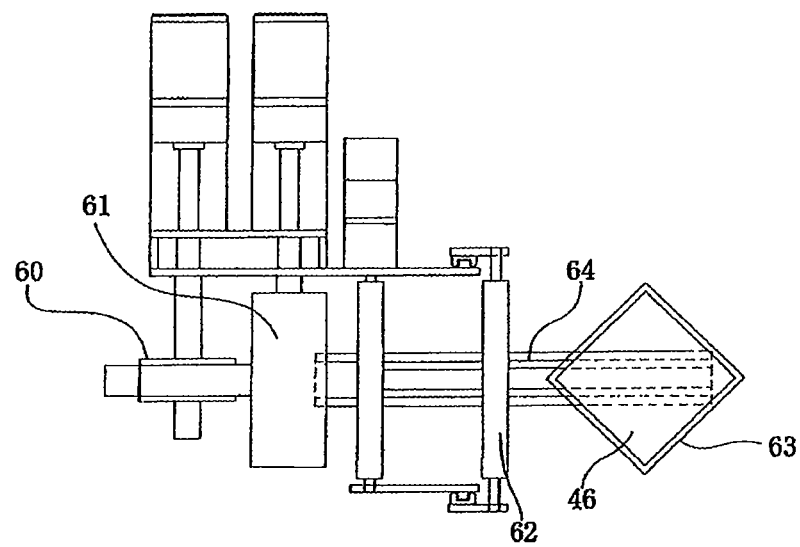
FIG. 25 is a partially enlarged illustration of the further embodiment.

The aforementioned provisionally laminated body (PL1) 46 sent to this support film removing device 58 is kept over the cooling plate 57 (with reference to FIG. 22) for a fixed time period. Thus, the resin film 20 of the provisionally laminated body (PL1) 46 is cooled to be rigidly attached to the substrate 38. Next, as shown in FIG. 25 which is a plan view of FIG. 24, for the purpose of removing the support film 21 from the provisionally laminated body (PL1) 46, a SCARA robot not shown rotates the provisionally laminated body (PL1) 46 through 45 degrees to place the provisionally laminated body (PL1) 46 onto the suction table 63. The provisionally laminated body (PL1) 46 is held under suction by the suction table 63. Then, the suction table 63 is moved to the position shown in FIG. 24. Then, the pressure roll 62 is moved downwardly toward the provisionally laminated body (PL1) 46 on the suction table 63 so that the removal tape lying between the provisionally laminated body (PL1) 46 and the pressure roll 62 is in pressure contact with the support film 21 on the provisionally laminated body (PL1) 46 surface. With the pressure contact maintained, the suction table 63 is slid to the position shown in FIG. 25 by the servomotor-driven LM actuator 64. At this time, the nip rolls t and u are driven so that a length of the removal tape equal to the distance the suction table 63 is slid is wound up. In this manner, the support film 21 of the provisionally laminated body (PL1) 46 is removed together with the removal tape, so that a provisionally laminated body (PL1) (65) is obtained. In FIG. 25, the removal tape being unwound from the unwind roll 60 and wound on the take-up roll 61 is not shown. The provisionally laminated body (PL1) (65) obtained by removing the support film 21 is returned onto the transport film 34 by the SCARA robot not shown. Then, the provisionally laminated body (PL1) (65) is transferred by the transport film 34 to the subsequent end laminated body forming block 5.

The end laminated body forming block 5 has the function of pressurizing the provisionally laminated body (PL1) (65) obtained by removing the support film 21 to form the end laminated body 36. Like the laminating apparatuses A and B according to the aforementioned embodiments, this laminating apparatus C uses the depressurizing and pressurizing tank 37 capable of switching between depressurization and pressurization as the enclosed space forming means for changing the provisionally laminated body (PL1) (65) into the end laminated body 36, and similarly changes the provisionally laminated body (PL1) (65) into the end laminated body (94). Specifically, in the enclosed space Z of the aforementioned depressurizing and pressurizing tank 37, the provisionally laminated body (PL1) (65) is subjected to depressurization and heating to change in shape from an initial condition such that the resin film 20 adheres to the protruding portions of the substrate 38 to a condition such that the resin film 20 loosely fits the uneven shape of the substrate 38 and finally into a condition such that the entire perimeter of the edges of the resin film 20 adheres to the peripheral portion of the surface of the substrate 38. In this manner, the provisionally laminated body (PL1) (65) is formed into an provisionally laminated body (PL2) (82) having the enclosed space (S) between the resin film 20 and the substrate 38 which is in a depressurized condition similar to that of the enclosed space Z thereround.

Next, the enclosed space Z of the depressurizing and pressurizing tank 37 is pressurized and heated, whereby the resin film 20 loosely fitting the protruding and recessed portions of the substrate 38 in the provisionally laminated body (PL2) (82) completely fits the protruding and recessed portions of the substrate 38. Then, the aforementioned heating rigidly attaches the resin film 20 to the substrate 38, with the resin film 20 fitting the protruding and recessed portions of the substrate 38. Thus, the end laminated body (94) is formed.

According to this laminating apparatus C, a relatively simple method using the removal tape is used to remove the support film 21 from the provisionally laminated body (PL1) 46 because the substrate 38 and the resin film 20 of the cut resin film 19 in the provisionally laminated body (PL1) 46 firmly adhere to each other by the contact lamination process. Also, the cut resin film 19 having the support film 21 is overlaid on the substrate 38 to form the provisionally laminated body (PL1) 46. Thus, a high degree of planarity maintaining characteristic of the support film 21 prevents the resin film 20 of the cut resin film 19 from becoming wrinkled to allow the resin film 20 to be overlaid on the substrate 38 while maintaining the planarity. With the resin film 20 of the cut resin film 19 maintaining the planarity relative to the substrate 38, the lamination process prior to the removal of the support film 21 clamps and integrates the cut resin film 19 and the substrate 38 together. Thus, after the support film 21 is removed, the resin film 20 is prevented from becoming wrinkled and maintains the planarity relative to the substrate 38. In this manner, the resin film 20 free from wrinkles is overlaid on the substrate 38 to provide the provisionally laminated body (PL1) (65). This provides the end laminated body (94) in which the thickness of the resin film 20 is more uniform and in which no microvoids are created between the resin film 20 and the substrate 38.

The contact laminating device 47 is used in the support film removing block 3 of the laminating apparatus C according to the embodiment of the present invention. Instead of the contact laminating device 47, an apparatus such as a contact laminating apparatus 77 (FIG. 26) and a contact laminating apparatus 78 (FIG. 27) and the like may be used. The use of the contact laminating apparatus 77 provides the provisionally laminated body (PL1) 46 in which the resin film 20 with the support film 21 and the substrate 38 are integrated together. Also, the use of the contact laminating apparatus 78 provides the provisionally laminated body (PL2) (81) with the support film 21 in which the space between the resin film 20 and the substrate 38 is placed under a negative pressure. The contact laminating apparatuses 77 and 78 are servo press apparatuses, and are capable of precisely controlling the spacing between the upper and lower pressing plates. Thus, the contact laminating apparatuses 77 and 78 are capable of easily controlling the thickness of the resin film 20. The contact laminating apparatuses 77 and 78 may be configured to perform a pressurizing process in non-contacting relationship in their own enclosed spaces without moving the provisionally laminated body (PL1) 46 and the provisionally laminated body (PL2) (81) from the contact laminating apparatuses 77 and 78 to other apparatuses (for example, the depressurizing and pressurizing tank 37 and the like) after the provisionally laminated body (PL1) 46 is obtained using the contact laminating apparatus 77 or after the provisionally laminated body (PL2) (81) is obtained using the contact laminating apparatus 78. This achieves further shortening of the manufacturing steps and savings in space for the installation of the apparatus, as compared with the laminating apparatus C.

Figure 26:
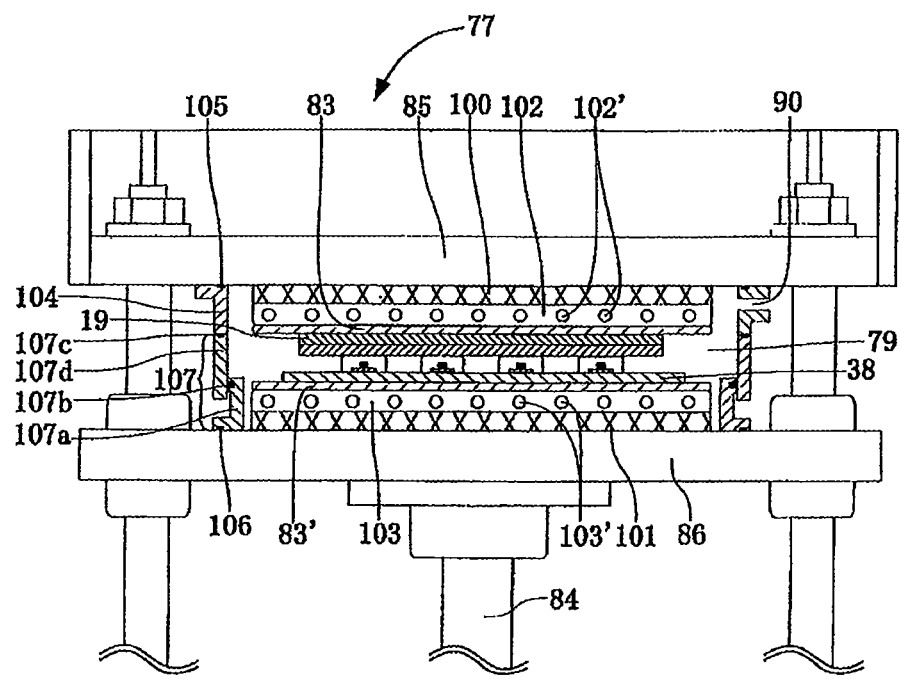
FIG. 26 is an illustration of the further embodiment.

As shown in FIG. 26, the aforementioned contact laminating apparatus 77 includes an upper plate portion 85 provided with a rubber 83, and a lower plate portion 86 provided with a rubber 83'. The upper plate portion 85 is provided with an upper heating platen 102 and a cartridge heater 102', with an upper thermal insulation material 100 therebetween. The lower plate portion 86 is provided with a lower heating platen 103 and a cartridge heater 103', with a lower thermal insulation material 101 therebetween. The rubbers 83 and 83' are mounted to surfaces where the upper and lower heating platens (102 and 103) are opposed to each other. A frame-shaped upper vacuum frame 104 having an air exhaust and supply channel 90 is mounted through a seal material 105 to the upper plate portion 85. A lower vacuum frame 107 is mounted through a seal material 106 to the lower plate portion 86. In the lower vacuum frame 107, a movable frame 107d having a seal material 107c on its upper surface is mounted through a lip packing 107b to a fixed frame 107a so that the aforementioned fixed frame 107a is fitted in the movable frame 107d. Also, the movable frame 107d is lifted upwardly by a spring not shown. The lower plate portion 86 is moved upwardly by a joint 84 connected to a ball screw driven by a servomotor, so that the upper vacuum frame 104 and the lower vacuum frame 107 come into engagement with each other, with the seal material 107c therebetween, whereby an enclosed space 79 is defined between the upper plate portion 85 and the lower plate portion 86. This enclosed space 79 is connected at the air exhaust and supply channel 90 to a vacuum suction device not shown (for example, a vacuum suction device, a vacuum regulator, atmosphere inlet piping, an air pressurizing device, and the like), whereby a depressurized condition or a pressurized condition is created in the enclosed space 79. Thus, after the provisionally laminated body (PL1) 46 is put into the aforementioned enclosed space 79 in non-contacting relationship with the rubber 83 of the upper heating platen 102, the enclosed space 79 is depressurized so that the lower heating platen 103 is moved upwardly to the position shown in FIG. 26. Thus, the provisionally laminated body (PL1) 46 is pressurized in a depressurized condition. This provides the provisionally laminated body (PL1) 46 in which the resin film 20 with the support film 21 and the substrate 38 are integrated together. The support film 21 is removed, as required, from the obtained provisionally laminated body (PL1), and pressurization is done in non-contacting relationship, whereby the end laminated body is obtained.

Figure 27:
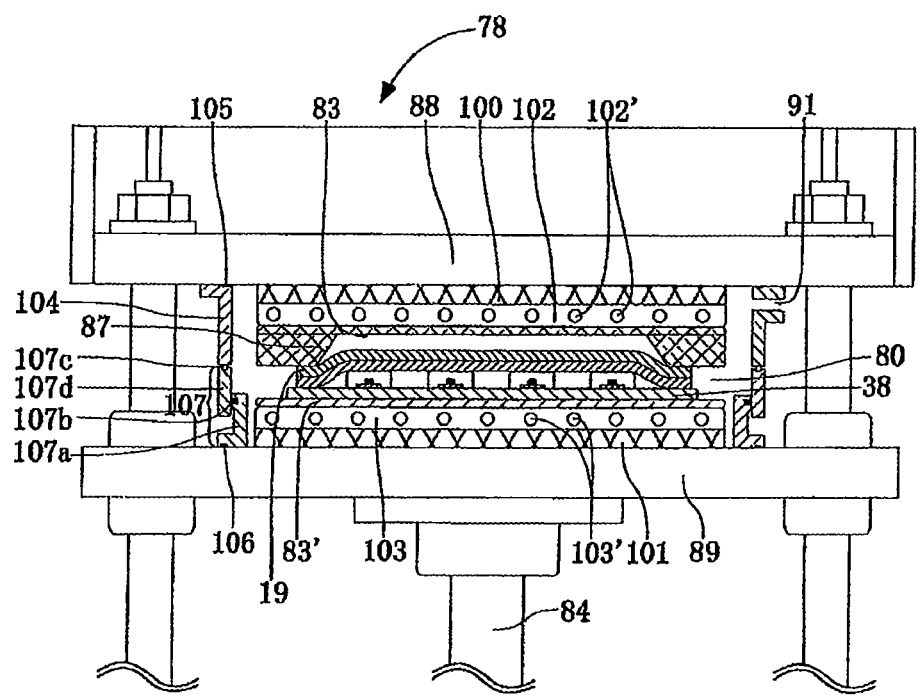
FIG. 27 is an illustration of the further embodiment.

Like the aforementioned contact laminating apparatus 77, the aforementioned contact laminating apparatus 78 includes an upper plate portion 88 provided with the rubber 83, and a lower plate portion 89 provided with the rubber 83', as shown in FIG. 27. Further, a pressing portion 87 for rapidly bringing the entire perimeter of the edges of the cut resin film 19 and the like into intimate contact with the peripheral portion of the surface of the substrate 38 is mounted to the lower surface of the upper plate portion 88. It is preferable to perform a releasing process such as coating with fluororesin and the like on a surface of the pressing portion 87 which contacts the cut resin film 19 and the like because of the good releasability of the pressing portion 87 from the cut resin film 19 and the like. The lower plate portion 89 is moved upwardly by the joint 84 connected to the ball screw driven by the servomotor, whereby an enclosed space 80 is defined between the upper plate portion 88 and the lower plate portion 89. The enclosed space 80 is connected at an air intake and supply channel 91 to a vacuum suction device not shown (for example, a vacuum suction device, a vacuum regulator, atmosphere inlet piping, an air pressurizing device, and the like), whereby a depressurized condition or a pressurized condition is created in the enclosed space 80. Thus, this contact laminating apparatus 78 provides not only the provisionally laminated body (PL1) 46 in which the resin film 20 with the support film 21 and the substrate 38 are integrated together but also the provisionally laminated body (PL2) (81) with the support film 21 in which the space between the resin film 20 and the substrate 38 is placed under a negative pressure. The support film 21 is removed, as required, from the obtained provisionally laminated body (PL1) or (PL2), and pressurization is done in non-contacting relationship, whereby the end laminated body is obtained.

Examples of the removal tape for use in the support film removing device 58 of the laminating apparatus C according to the embodiment of the present invention include a protective film affixed to a silicon wafer in the step of dicing the wafer to form a thin film and the like, and a removal tape for use in the removal of a dicing tape. In particular, SCOTCH polyester tape No. 3305 manufactured by Sumitomo 3M Limited, and an adhesive tape made of a rubber-based adhesive material such as ELEP HOLDER ELP BT-315 and the like manufactured by Nitto Denko Corporation are preferably used.

Figure 20A:
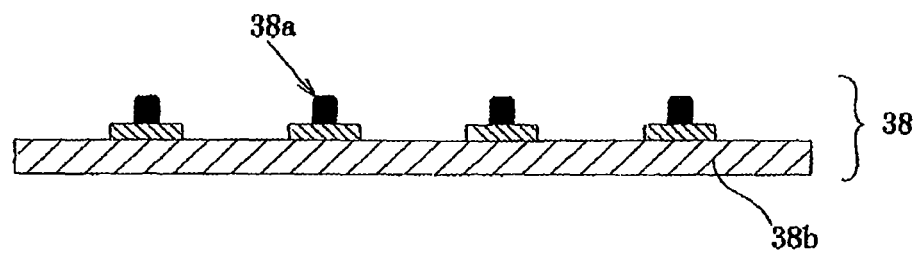
FIGS. 20A and 20B are illustrations of another embodiment of the present application.
Figure 20B:
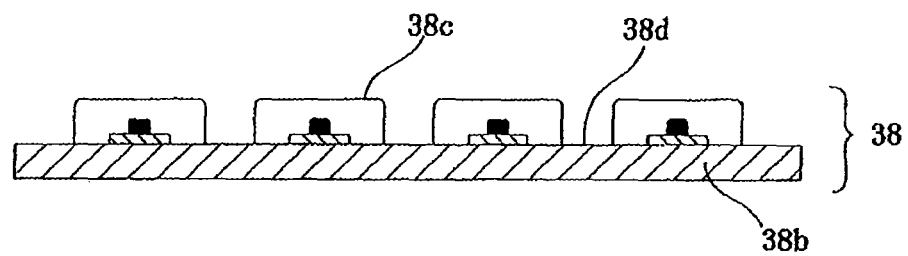

A substrate having relatively large protruding and recessed portions is in particular preferably used as the substrate 38 having the protruding and recessed portions for use in the present invention. Examples of such a board include an LED board such that light-emitting elements (LEDs) disposed in predetermined spaced apart relation and serving as protruding portions 38a (having a height of approximately 200 µm) are provided on the insulative board 38b (having a thickness of approximately 600 µm) made of resin or ceramic and the like as shown in FIG. 20A, and an LED board such that surface-mount light-emitting elements (LEDs) are surface-mounted on the board 38b to serve as the protruding portions 38c (having a height of approximately 1.35 mm) disposed in predetermined spaced apart relation (FIG. 20B). In addition, the substrate 38 is preferably used for a printed board having a pattern of copper and the like, and a multiple laminated board for use in a build-up process such that substrate has relatively small protruding and recessed portions. Therefore, the laminating apparatus according to the present invention is effectively used for the sealing of a semiconductor device on the wafer level, the protection of a semiconductor chip surface mounted on an organic board, the sealing of an LED device, the sealing of a solar cell, the formation of a resist layer of a board for use in a semiconductor, an LED, an optical device and a solar cell, and the like.

A resin composition having properties excellent in adhesion, insulation, adhesiveness, and hot melt is suitable for the resin film 20. Examples of such a resin composition include resin films (resin compositions) prepared by mixing a stabilizer, a hardener, coloring matter or dyestuff, a lubricant and the like in a thermosetting resin, a thermoplastic resin and the like. Specific examples of the resin composition include silicone resins, polyimide resins, epoxy resins, acrylic resins, and compositions prepared by adding various inorganic fillers to these resins. Examples of the aforementioned inorganic fillers used herein include thermally conductive fillers, fillers excellent in electrical conductivity, coloring agents such as carbon blacks in addition to silica, fine powder silica, alumina, fluorescent materials such as YAG, and titanium oxide.

Figure 28:
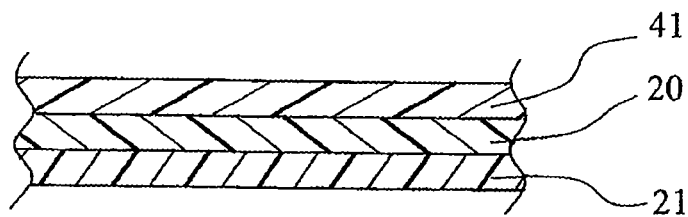
FIG. 28 is an illustration of one embodiment of the present application.

The aforementioned resin film 20 is generally used by laminating the support film 21 thereto. Examples of this support film 21 include polyethylene terephthalate films, polypropylene films, polyvinyl alcohol films, and saponified ethylene-vinyl acetate copolymer films. An example of the resin film with the support film for use in semiconductor light-emitting elements includes the fluorescent-material-containing silicone resin film 20 (having a thickness of approximately 40 μm, for example) provided with the support film 21 (having a thickness of approximately 40 μm, for example) on the back surface thereof and a cover film 41 (having a thickness of approximately 30 μm, for example) on the front surface thereof, as shown in FIG. 28. Similarly, a dry film solder resist having a three-layer structure comprised of a support film, a photosensitive resin composition and a cover film which is used for the protection of an interconnecting pattern of the outermost layer of a printed wiring board may be used. It is only necessary that the support film is removed from the resin film with the support film for use in semiconductor light-emitting elements before the resin film is thermally hardened by postcure. Thus, the removal of the support film 21 may be done either before or after the lamination to the board. In the case of the dry film solder resist used for the protection of an interconnecting pattern of the outermost layer of a printed wiring board, however, the support film is removed after the lamination to the board for the purpose of preventing the photosensitive resin composition from being deposited onto a pattern mask during exposure using the pattern mask.

EXAMPLES

Inventive examples using a laminating apparatus according to the present invention will be described.

Prior to the inventive examples, preparations to be described next were made. First, boards I to III to be described below were prepared as the substrate 38 having protruding and recessed portions. Resin films α and β with support films were prepared as the resin film 20. The resin films α and β with the support films were previously produced by coating elongated strip-shaped support films having a width of 80 mm with thermosetting resin compositions α and β, respectively, having a thickness of 40 μm and a width of 65 mm to be described below into the form of resin films. The resin films α and β have a cover film of 80 mm in width, and are wound around a core tube into a roll in such a manner that the support films are positioned outside.

<Board I>

A board in which semiconductor light-emitting elements (gallium nitride) are flip-chip mounted on a (ceramic) board provided with positive and negative electrodes having a predetermined conductive pattern (having a height of 50 μm).

This board is of a square configuration with each side measuring 70 mm, and has a thickness of 600 μm. The thickness as measured from the surface of the board to the top of the semiconductor light-emitting elements mounted on the conductive pattern is 200 μm. The aforementioned semiconductor light-emitting elements mounted are arranged in an array with five rows and five columns, i.e. a total of 25 semiconductor light-emitting elements, spaced 1 cm apart from each other.

<Board II>

Surface-mount semiconductor light-emitting elements (gallium nitride) in the form of a cube having a width of 5 mm, a depth of 5 mm and a height of 1.35 mm were surface-mounted, in place of the semiconductor light-emitting elements (gallium nitride) were flip-chip mounted on the board I. The height from the bottom surface of the board II to the upper end of the surface-mount semiconductor light-emitting elements is 2000 μm.

<Board III>

A board which includes a conductive pattern similar to that of the board I but having a height of 100 μm, and which does not include electronic components mounted thereon such as the aforementioned semiconductor light-emitting elements.

<Resin Composition α>

A thermosetting silicone resin composition containing a fluorescent material.

<Resin Composition β>

A thermosetting photosensitive epoxy acrylic acid copolymer resin composition.

Inventive Example 1

(End Laminated Body with Board I)

The laminating apparatus A shown in FIG. 1 was used to laminate the board I and the resin film α together. The board I is stored in the substrate rack 33. This substrate rack 33 has four wall surfaces and two open sides (front and back sides) which are defined by a top plate, a bottom plate and two side plates. The laminating apparatus A is designed such that the insertion of a substrate ejection bar from one (e.g., the front side) of the open sides into the substrate rack 33 allows the board I to be ejected toward the opposite open side (e.g., the back side). A large number of horizontal ribs are provided on the inside of the two side plates so as to accommodate such boards I in multiple tiers, as indicated by dotted lines in FIG. 18. With the board I stored in the substrate rack 33, the opposite ends of the board I are placed on corresponding ones of the ribs. Then, the resin film α prepared in the form of a roll as mentioned above was set on the unwind roll 6 of the cutting block 1, and the substrate rack 33 with the board I stored therein was set in a predetermined position of the provisionally laminated body forming block 4. Then, the laminating apparatus A was put into automatic operation to produce an end laminated body.

More specifically, the first step of the automatic operation of the laminating apparatus A was to perform a process step in the cutting block 1, thereby providing the resin film α with the support film (the cut resin film 19) cut to dimensions of 65 by 75 mm, with the cover film removed therefrom. Next, the cut resin film 19 was precured for three minutes in the oven 12 adjusted to the thermal curing temperature of thermosetting silicone resin compositions containing a fluorescent material, and the half cutting device 13 was used to make a half cut in the cut resin film 19. Then, the support film removing device 14 was used to remove the support film from the cut resin film 19, thereby providing the resin film α having dimensions of 65 by 65 mm. The resin film α and the board I having the protruding and recessed portions were joined together so that the barycentric positions thereof coincided with each other, to form the provisionally laminated body (PL1) 31. Further, the aforementioned provisionally laminated body (PL1) 31 was placed in the depressurizing and pressurizing tank 37 (FIG. 19) including a heating platen the temperature of which was previously adjusted to one half the thermal curing temperature of the resin film α, and a condition in which the pressure in the depressurizing and pressurizing tank 37 was reduced (to 50 Pa) was held for two minutes. This provided the provisionally laminated body (PL2) (72) including the enclosed space (S) with a reduced-pressure atmosphere between the board I and the resin film α of the aforementioned provisionally laminated body (PL1) 31. After the provisionally laminated body (PL2) (72) was formed, the atmosphere was introduced through an opening of the depressurizing and pressurizing tank 37 into the depressurizing and pressurizing tank 37. Further, compressed air at 0.3 MPa was introduced into the depressurizing and pressurizing tank 37. Using a difference in air pressure between the enclosed space Z in the depressurizing and pressurizing tank 37 and the enclosed space (S) in the provisionally laminated body (PL2) (72), the laminating process was completed, with the resin film α kept in intimate contact with the board I of the provisionally laminated body (PL2) (72), whereby the intended end laminated body 36 including the board I and the resin film α was provided.

(End Laminated Body with Board II)

A similar process was performed except that the board I was replaced with the board II, whereby the end laminated body 36 including the board II and the resin film α was provided.

Inventive Example 2

(End Laminated Body with Board I)

An end laminated body was formed in a manner similar to that in Inventive Example 1 except that the contact laminating apparatus 78 shown in FIG. 27 was used in place of the depressurizing and pressurizing tank 37 of the laminating apparatus A shown in FIG. 1. Specifically, the provisionally laminated body (PL1) 31 was initially formed in a manner similar to that in Inventive Example 1. Next, the provisionally laminated body (PL1) 31 was placed in the contact laminating device 78 (FIG. 27) including a heating platen the temperature of which was previously adjusted to one half the thermal curing temperature of the resin film α, and the pressure in the enclosed space 80 of the contact laminating device 78 was reduced (to 50 Pa). Thereafter, with a spacing of 630 μm kept between the pressing portion 87 of an upper elastic pressing plate and the upper surface of a lower elastic pressing plate, the periphery of the resin film a was sealed. This provided the provisionally laminated body (PL2) (72) including the enclosed space (S) with a reduced-pressure atmosphere between the board I and the resin film α of the aforementioned provisionally laminated body (PL1) 31. After the provisionally laminated body (PL2) (72) was formed, the atmosphere was introduced through the air intake and supply channel 91 of the aforementioned contact laminating device 78 into the enclosed space 80. Further, compressed air was introduced into the enclosed space 80. Using a difference in air pressure between the enclosed space 80 in the contact laminating device 78 and the enclosed space (S) in the provisionally laminated body (PL2), the process of laminating the resin film α to the board I was completed, whereby the intended end laminated body 36 including the board I and the resin film α was provided.

(End Laminated Body with Board II)

A similar process was performed except that the board I was replaced with the board II, whereby the end laminated body 36 including the board II and the resin film α was provided.

Inventive Example 3

(End Laminated Body with Board I)

The laminating apparatus C shown in FIG. 22 was used to provide the resin film α with the support film (the cut resin film 19) cut to dimensions of 65 by 65 mm. This was precured in a manner similar to that in Inventive Example 1, and the half cut was not made. Then, the cut resin film 19 and the board I were joined together so that the barycentric positions thereof coincided with each other, to form the provisionally laminated body (PL1) 46.

Next, the provisionally laminated body (PL1) 46 was placed in the enclosed space 53 in the contact laminating device 47 (FIG. 23) including a heating platen the temperature of which was previously adjusted to one half the thermal curing temperature of the resin film α, and the pressures in the enclosed space 53 and in the gap portion 52 were reduced to 50 Pa. Then, while the pressure in the enclosed space 53 was kept at the reduced pressure of 50 Pa, the pressure in the gap portion 52 was brought back to the atmospheric pressure through the opening channel 54 and the piping connection port 49c to expand the upper flexible sheet 48 toward the enclosed space 53. This condition was held for five seconds, so that the provisionally laminated body (PL1) 46 was clamped. This achieved a contact lamination process for rigidly attaching the resin film α with the support film and protruding portions of the board I together in the aforementioned provisionally laminated body (PL1) 46. The provisionally laminated body (PL1) 46 subjected to the aforementioned contact lamination process was cooled down to near room temperature on the cooling plate 57. Thereafter, the support film removing device 58 (a removal tape or ELEP HOLDER ELP BT-315 manufactured by Nitto Denko Corporation) was used to remove the support film from the provisionally laminated body (PL1) 46, so that the provisionally laminated body (PL1) (65) was provided. The provisionally laminated body (PL1) (65) was placed in the depressurizing and pressurizing tank 37 (FIG. 19) including the heating platen the temperature of which was previously adjusted to one half the thermal curing temperature of the resin film α. After the provisionally laminated body (PL1) (65) was placed in the depressurizing and pressurizing tank 37, the pressure in the depressurizing and pressurizing tank 37 was reduced (to 50 Pa) to change the provisionally laminated body (PL1) (65) into the provisionally laminated body (PL2) (82) including the enclosed space (S) with a reduced-pressure atmosphere between the board I and the resin film α. After the provisionally laminated body (PL2) (82) was formed, compressed air was introduced through the opening of the depressurizing and pressurizing tank 37 into the aforementioned depressurizing and pressurizing tank 37. Using a difference in air pressure between the enclosed space Z in the depressurizing and pressurizing tank 37 and the enclosed space (S) in the provisionally laminated body (PL2) (82), the laminating process was completed, with the resin film α kept in intimate contact with the board I of the provisionally laminated body (PL2) (82), whereby the intended end laminated body (94) including the board I was provided.

(End Laminated Body with Board II)

A similar process was performed except that the board I was replaced with the board II, whereby the end laminated body (94) including the board II and the resin film α was provided.

Inventive Example 4

(End Laminated Body with Board I)

An end laminated body was formed in a manner similar to that in Inventive Example 3 except that the contact laminating device 77 (FIG. 26) was used in place of the contact laminating device 47 in the laminating apparatus C shown in FIG. 22. Specifically, the provisionally laminated body (PL1) 46 was placed in the enclosed space 79 in the contact laminating device 77 (FIG. 26) including a heating platen the temperature of which was previously adjusted to one half the thermal curing temperature of the resin film 20, and the pressure in the enclosed space 79 was reduced to 50 Pa. The provisionally laminated body (PL1) 46 was clamped, with a spacing of 790 μm kept between the lower end surface of the upper elastic pressing plate and the upper surface of the lower elastic pressing plate. This achieved a contact lamination process for rigidly attaching the resin film α of the cut resin film 19 and protruding portions of the board I together in the aforementioned provisionally laminated body (PL1) 46. Except for these differences, a process similar to that in Inventive Example 3 was performed to complete the laminating process, thereby providing the intended end laminated body (94) including the board I.

(End Laminated Body with Board II)

A similar process was performed except that the board I was replaced with the board II and that the provisionally laminated body (PL1) 46 was clamped, with a spacing of 1990 μm kept between the lower end surface of the upper elastic pressing plate and the upper surface of the lower elastic pressing plate in the contact laminating device 77 (FIG. 26), whereby the end laminated body (94) including the board II and the resin film α was provided.

Inventive Example 5

(End Laminated Body with Board I)

An end laminated body was formed in a manner similar to that in Inventive Example 3 except that the contact laminating device 78 (FIG. 27) was used in place of the depressurizing and pressurizing tank 37 in the laminating apparatus C shown in FIG. 22. Specifically, the provisionally laminated body (PL1) (65) was placed in the enclosed space 80 in the contact laminating device 78 (FIG. 27) including the heating platen the temperature of which was previously adjusted to one half the thermal curing temperature of the resin film α, and the pressure in the enclosed space 80 was reduced to 50 Pa. With a spacing of 630 μm kept between the lower end surface of the upper elastic pressing plate and the upper surface of the lower elastic pressing plate, the periphery of the resin film α was clamped, whereby the provisionally laminated body (PL2) (82) including the enclosed space (S) with a reduced-pressure atmosphere between the board I and the resin film α of the provisionally laminated body (PL1) (65) was formed. After the provisionally laminated body (PL2) (82) was formed in this manner, the atmosphere was introduced through the air intake and supply channel 91 of the contact laminating device 78 into the enclosed space 80. Further, compressed air at 0.3 MPa was introduced into the enclosed space 80. Using a difference in air pressure between the enclosed space 80 in the contact laminating device 78 and the enclosed space (S) in the provisionally laminated body (PL2) (82), the process of laminating the board I and the resin film a together was completed, whereby the intended end laminated body (94) including the board I was provided.

(End Laminated Body with Board II)

A similar process was performed except that the board I was replaced with the board II, whereby the end laminated body (94) including the board II and the resin film α was provided.

Inventive Example 6

(End Laminated Body with Board I)

In Inventive Example 3, the pressures in the enclosed space 53 and in the gap portion 52 in the contact laminating device 47 were reduced to 50 Pa. Then, while the pressure in the enclosed space 53 was kept at the reduced pressure of 50 Pa, the pressure in the gap portion 52 was brought back to the atmospheric pressure and then increased to 0.2 MPa to expand the upper flexible sheet 48 toward the enclosed space 53. This condition was held for ten seconds, so that the provisionally laminated body (PL1) 46 was clamped. This formed the provisionally laminated body (PL2) (81) in which the resin film α and the protruding portions of the board I were rigidly attached together and in which the enclosed space (S) with a reduced-pressure atmosphere was defined between the board I and the resin film α, in place of the provisionally laminated body (PL1) 46 subjected to the contact lamination process. Except for these differences, a process similar to that in Inventive Example 3 was performed to complete the laminating process, thereby providing the intended end laminated body (94) including the board I.

(End Laminated Body with Board II)

A similar process was performed except that the board I was replaced with the board II, whereby the end laminated body (94) including the board II and the resin film α was provided.

Inventive Example 7

(End Laminated Body with Board III)

A process similar to that in Inventive Example 1 was performed to complete the laminating process, except that the board III and the resin film β were used and that the process of removing the support film was not performed, whereby the intended end laminated body (93) including the board III and the resin film β with the support film was provided.

Inventive Example 8

(End Laminated Body with Board III)

A process similar to that in Inventive Example 2 was performed to complete the laminating process, except that the board III and the resin film were used and that the process of removing the support film was not performed, whereby the intended end laminated body (93) including the board III and the resin film β with the support film was provided.

Inventive Example 9

(End Laminated Body with Board III)

A process similar to that in Inventive Example 3 was performed to complete the laminating process, except that the board III and the resin film β were used and that the process of removing the support film was not performed, whereby the intended end laminated body (93) including the board III and the resin film β with the support film was provided.

Inventive Example 10

(End Laminated Body with Board III)

A process similar to that in Inventive Example 4 was performed to complete the laminating process, except that the board III and the resin film β were used and that the process of removing the support film was not performed, whereby the intended end laminated body (93) including the board III and the resin film β with the support film was provided.

Inventive Example 11

(End Laminated Body with Board III)

A process similar to that in Inventive Example 5 was performed to complete the laminating process, except that the board III and the resin film β were used and that the process of removing the support film was not performed, whereby the intended end laminated body (93) including the board III and the resin film β with the support film was provided.

Inventive Example 12

(End Laminated Body with Board III)

A process similar to that in Inventive Example 6 was performed to complete the laminating process, except that the board III and the resin film β were used and that the process of removing the support film was not performed, whereby the intended end laminated body (93) including the board III and the resin film β with the support film was provided.

Comparative Example 1

(End Laminated Body with Board I)

An end laminated body was formed in a manner similar to that in Inventive Example 1 except that the contact laminating device 47 (FIG. 23) was used in place of the depressurizing and pressurizing tank 37 in the laminating apparatus A shown in FIG. 1. Specifically, the provisionally laminated body (PL1) 31 was placed in the enclosed space 53 in the contact laminating device 47 including the heating platen the temperature of which was previously adjusted to one half the thermal curing temperature of the resin film α, and the pressures in the enclosed space 53 and in the gap portion 52 were reduced to 50 Pa. Then, while the pressure in the enclosed space 53 was kept at the reduced pressure of 50 Pa, the pressure in the gap portion 52 was brought back to the atmospheric pressure to expand the upper flexible sheet 48 toward the enclosed space 53. This condition was held for 20 seconds, so that the provisionally laminated body (PL1) 31 was clamped. The laminating process was completed, whereby the intended end laminated body including the board I and the resin film α was provided.

(End Laminated Body with Board II)

A similar process was performed except that the board I was replaced with the board II, whereby an end laminated body including the board II and the resin film α was provided.

Comparative Example 2

(End Laminated Body with Board I)

An end laminated body was formed in a manner similar to that in Inventive Example 3 except that the contact laminating device 47 (FIG. 23) was used in place of the depressurizing and pressurizing tank 37 in the laminating apparatus C shown in FIG. 22. Specifically, the provisionally laminated body (PL1) 46 was placed in the enclosed space 53 in the contact laminating device 47 (FIG. 23) including the heating platen the temperature of which was previously adjusted to one half the thermal curing temperature of the resin film α, and the pressures in the enclosed space 53 and in the gap portion 52 were reduced to 50 Pa. Then, while the pressure in the enclosed space 53 was kept at the reduced pressure of 50 Pa, the pressure in the gap portion 52 was brought back to the atmospheric pressure to expand the upper flexible sheet 48 toward the enclosed space 53. This condition was held for five seconds, so that the provisionally laminated body (PL1) 46 was clamped. This achieved a contact lamination process for rigidly attaching the resin film a in the resin film α with the support film and protruding portions of the board I together in the aforementioned provisionally laminated body (PL1) 46. The provisionally laminated body (PL1) 46 subjected to the aforementioned contact lamination process was cooled down to near room temperature on the cooling plate 57. Thereafter, the support film removing device 58 (a removal tape or ELEP HOLDER ELP BT-315 manufactured by Nitto Denko Corporation) was used to remove the support film from the provisionally laminated body (PL1) 46, thereby providing the provisionally laminated body (PL1) (65). Thereafter, the provisionally laminated body (PL1) (65) was placed again in the enclosed space 53 in the contact laminating device 47 (FIG. 23) including the heating platen the temperature of which was previously adjusted to one half the thermal curing temperature of the resin film α, and the pressures in the enclosed space 53 and in the gap portion 52 were reduced to 50 Pa. Then, while the pressure in the enclosed space 53 was kept at the reduced pressure of 50 Pa, the pressure in the gap portion 52 was brought back to the atmospheric pressure to expand the upper flexible sheet 48 toward the enclosed space 53. This condition was held for 20 seconds, so that the provisionally laminated body (PL1) (65) was clamped. The laminating process was completed, whereby the intended end laminated body including the board I and the resin film α was provided.

(End Laminated Body with Board II)

A similar process was performed except that the board I was replaced with the board II, whereby an end laminated body including the board II and the resin film α was provided.

Comparative Example 3

(End Laminated Body with Board I)

A process similar to that in Comparative Example 1 was performed to complete the laminating process, except that the contact laminating device 47 (FIG. 23) expanded the upper flexible sheet 48 toward the enclosed space 53 for five seconds and thereafter further applied a pressure of 0.2 MPa to the gap portion 52 to expand the upper flexible sheet 48 toward the enclosed space 53 for 20 seconds, whereby an intended end laminated body including the board I and the resin film α was provided.

(End Laminated Body with Board II)

A similar process was performed except that the board I was replaced with the board II, whereby an end laminated body including the board II and the resin film α was provided.

Comparative Example 4

(End Laminated Body with Board I)

A process similar to that in Comparative Example 1 was performed to complete the laminating process, except that the contact laminating device 47 (FIG. 23) expanded the upper flexible sheet 48 toward the enclosed space 53 for five seconds and thereafter further applied a pressure of 0.5 MPa to the gap portion 52 to expand the upper flexible sheet 48 toward the enclosed space 53 for 20 seconds, whereby an intended end laminated body including the board I and the resin film α was provided.
(End Laminated Body with Board II)
A similar process was performed except that the board I was replaced with the board II, whereby an end laminated body including the board II and the resin film α was provided.

Comparative Example 5

(End Laminated Body with Board I)
A process similar to that in Comparative Example 2 was performed to complete the laminating process, except that the contact laminating device 47 (FIG. 23) expanded the upper flexible sheet 48 toward the enclosed space 53 for five seconds and thereafter further applied a pressure of 0.2 MPa to the gap portion 52 to expand the upper flexible sheet 48 toward the enclosed space 53 for 20 seconds, whereby an intended end laminated body including the board I and the resin film α was provided.
(End Laminated Body with Board II)
A similar process was performed except that the board I was replaced with the board II, whereby an end laminated body including the board II and the resin film α was provided.

Comparative Example 6

(End Laminated Body with Board I)
A process similar to that in Comparative Example 2 was performed to complete the laminating process, except that the contact laminating device 47 (FIG. 23) expanded the upper flexible sheet 48 toward the enclosed space 53 for five seconds and thereafter further applied a pressure of 0.5 MPa to the gap portion 52 to expand the upper flexible sheet 48 toward the enclosed space 53 for 20 seconds, whereby an intended end laminated body including the board I and the resin film α was provided.
(End Laminated Body with Board II)
A similar process was performed except that the board I was replaced with the board II, whereby an end laminated body including the board II and the resin film α was provided.

Comparative Example 7

(End Laminated Body with Board III)
A process similar to that in Inventive Example 9 was performed to complete the laminating process, except that the laminating process was not performed by the depressurizing and pressurizing tank 37, whereby an intended end laminated body including the board III and the resin film β with the support film was provided.

Comparative Example 8

(End Laminated Body with Board III)
A process similar to that in Comparative Example 7 was performed to complete the laminating process, except that the length of time that the contact laminating device 47 (FIG. 23) expanded the upper flexible sheet 48 toward the enclosed space 53 was changed from five seconds to 20 seconds, whereby an intended end laminated body including the board III and the resin film β with the support film was provided.

Comparative Example 9

(End Laminated Body with Board III)
A process similar to that in Comparative Example 7 was performed to complete the laminating process, except that the contact laminating device 47 (FIG. 23) expanded the upper flexible sheet 48 toward the enclosed space 53 for five seconds and thereafter further applied a pressure of 0.2 MPa to the gap portion 52 to expand the upper flexible sheet 48 toward the enclosed space 53 for 20 seconds, whereby an intended end laminated body including the board III and the resin film β with the support film was provided.

Comparative Example 10

(End Laminated Body with Board III)
A process similar to that in Comparative Example 7 was performed to complete the laminating process, except that the contact laminating device 47 (FIG. 23) expanded the upper flexible sheet 48 toward the enclosed space 53 for five seconds and thereafter further applied a pressure of 0.5 MPa to the gap portion 52 to expand the upper flexible sheet 48 toward the enclosed space 53 for 20 seconds, whereby an intended end laminated body including the board III and the resin film β with the support film was provided.

Evaluations of productive capacity, conformability, and film thickness uniformity were performed on the end laminated bodies provided in Inventive Examples 1 to 12 and Comparative Examples 1 to 10 in a manner to be described below. The results of the evaluations were listed in Tables 1 and 2 below.

<Productive Capacity>
The evaluations were based on the productive capacity of accepted products per hour in the following manner.
⊚: 40 accepted products or more
◯: 21 to 39 accepted products
Δ: 1 to 20 accepted products
x: no accepted products <Conformability>
The conformability of a resin film to a board having protruding and recessed portions was visually recognized under a microscope of 100× power, and was evaluated in the following manner.
◯: The resin film completely fills the recessed portions of the board having the protruding and recessed portions.
Δ: The resin film substantially completely fills the recessed portions of the board having the protruding and recessed portions, but a small number of microvoids are found in some of the recessed portions (or a recessed surface) of the board having the protruding and recessed portions.
x: The resin film does not completely fill the recessed portions of the board having the protruding and recessed portions, and microvoids remain in the recessed portions (or a recessed surface) of the board having the protruding and recessed portions.

<Film Thickness Uniformity>
Each of the end laminated bodies was cut vertically by a cross section method. The vertical section of each of the end laminated bodies was observed under a microscope and was evaluated in the following manner.
⊚: A difference in level between the protruding and recessed portions of the resin film on the protruding portions of the board is less than 1 μm.
◯: A difference in level between the protruding and recessed portions of the resin film on the protruding portions of the board is not less than 1 μm and is less than 2 μm.
Δ: A difference in level between the protruding and recessed portions of the resin film on the protruding portions of the board is not less than 2 μm and is less than 3 μm.

x: A difference in level between the protruding and recessed portions of the resin film on the protruding portions of the board is not less than 3 μm.

TABLE 1

|  | Productive capacity | Board I | | Board II | |
| --- | --- | --- | --- | --- | --- |
|  |  | Conformability | Film thickness uniformity | Conformability | Film thickness uniformity |
| Inventive Example 1 | △ | ○ | ◎ | ○ | ○ |
| Inventive Example 2 | ◎ | ○ | ◎ | ○ | ○ |
| Inventive Example 3 | △ | ○ | ○ | ○ | ○ |
| Inventive Example 4 | △ | ○ | ◎ | ○ | ◎ |
| Inventive Example 5 | ◎ | ○ | ○ | ○ | ○ |
| Inventive Example 6 | ○ | ○ | ○ | ○ | ○ |
| Comparative Example 1 | X | X | X | X | X |
| Comparative Example 2 | X | X | X | X | X |
| Comparative Example 3 | X | X | X | X | X |
| Comparative Example 4 | X | X | X | X | X |
| Comparative Example 5 | X | X | X | X | X |
| Comparative Example 6 | X | X | X | X | X |

TABLE 2

|  | Board III | | |
| --- | --- | --- | --- |
|  | Productive capacity | Conformability | Film thickness uniformity |
| Inventive Example 7 | △ | ○ | ◎ |
| Inventive Example 8 | ◎ | ○ | ◎ |
| Inventive Example 9 | △ | ○ | ○ |
| Inventive Example 10 | △ | ○ | ◎ |
| Inventive Example 11 | ◎ | ○ | ○ |
| Inventive Example 12 | ○ | ○ | ○ |
| Comparative Example 7 | X | X | ○ |
| Comparative Example 8 | X | X | ○ |
| Comparative Example 9 | X | △ | X |
| Comparative Example 10 | X | ○ | X |

Although a specific form in the present invention has been described in the aforementioned examples, the aforementioned examples should be considered as merely illustrative and not restrictive. It is contemplated that various modifications falling within the equivalent range of the claims could be made without departing from the scope of the present invention.

The laminating apparatus according to the present invention is usable as an apparatus for laminating a resin film to a substrate having protruding and recessed portions in the manufacture of an electronic circuit board and a semiconductor device.

The invention claimed is:

1. A laminating apparatus for a provisionally laminated body including a substrate having front and back surfaces at least one of which has an uneven surface comprising protruding and recessed portions, and one of a first resin film and a second resin film attached to the uneven surface of the substrate, the second resin film including a support film, the laminating apparatus being configured to form an end laminated body including one of the first resin film and the second resin film conforming to the protruding and recessed portions of the substrate, the laminating apparatus comprising:
   a first laminating mechanism including:
      a first enclosed space forming receiver capable of receiving the provisionally laminated body therein;
      a depressurizer capable of placing a space between one of the first resin film and the second resin film and the substrate of the provisionally laminated body under a negative pressure in a first enclosed space formed by the first enclosed space forming receiver;
      a heater configured to heat the one of the first resin film and the second resin film of the provisionally laminated body to provide a heated and softened one of the first resin film and the second resin film; and
      a first pressure laminator for bringing a peripheral portion of the heated and softened one of the first resin film and the second resin film of the provisionally laminated body into intimate contact with the substrate and configured to form an intermediate laminated body having a depressurized enclosed space between the one of the first resin film and the second resin film and the substrate thereof, and
   a second laminating mechanism including:
      a second enclosed space forming receiver configured for receiving the intermediate laminated body therein; and
      a second pressure laminator, which is configured for applying pressure to a second enclosed space formed by the second enclosed space forming receiver and to form the end laminated body in a non-contacting manner, in which the second pressure laminator is in a non-contacting relationship with the one of the first resin film and the second resin film, by creating air pressure difference between the second enclosed space and the depressurized enclosed space formed in the intermediate laminated body,
   wherein the second pressure laminator further includes a controller for controlling the applying of the pressure.

2. The laminating apparatus according to claim 1, wherein, as the first pressure laminator, a frame-shaped presser structured and arranged to be contactable with a periphery of the one of the first resin film and the second resin film for positively laminating the periphery of the one of the first resin film and the second resin film to the substrate is provided.

3. The laminating apparatus according to claim 1, further comprising:
   a first transporting mechanism for transporting the provisionally laminated body to the first laminating mechanism;
   a second transporting mechanism for transporting to the second laminating mechanism the intermediate laminated body formed by the first laminating mechanism; and a third transporting mechanism for transporting the end laminated body formed by the second laminating mechanism out of the second laminating mechanism.

4. The laminating apparatus according to claim 1, further comprising:
a support film remover for removing the support film from the second resin film.

5. The laminating apparatus according to claim 1, comprising:
a cutter for cutting one of the first resin film and the second resin film to a predetermined size; and
a precurer for precuring one of the first resin film and the second resin film.

* * * * *